United States Patent
Kato et al.

(10) Patent No.: US 8,598,648 B2
(45) Date of Patent: Dec. 3, 2013

(54) SEMICONDUCTOR DEVICE AND DRIVING METHOD OF SEMICONDUCTOR DEVICE

(75) Inventors: Kiyoshi Kato, Kanagawa (JP); Satohiro Okamoto, Fukuroi (JP); Shuhei Nagatsuka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 350 days.

(21) Appl. No.: 13/044,674

(22) Filed: Mar. 10, 2011

(65) Prior Publication Data

US 2011/0227062 A1    Sep. 22, 2011

(30) Foreign Application Priority Data

Mar. 19, 2010    (JP) .................. 2010-064819

(51) Int. Cl.
*H01L 29/788* (2006.01)

(52) U.S. Cl.
USPC .................. 257/316; 257/326; 365/189.19

(58) Field of Classification Search
USPC .................. 257/316, 326, 390; 365/189.19
See application file for complete search history.

(56) References Cited

U.S. PATENT DOCUMENTS

| | | | |
|---|---|---|---|
| 5,712,817 | A | 1/1998 | Suh |
| 5,731,856 | A | 3/1998 | Kim et al. |
| 5,744,864 | A | 4/1998 | Cillessen et al. |
| 6,127,702 | A | 10/2000 | Yamazaki et al. |
| 6,294,274 | B1 | 9/2001 | Kawazoe et al. |
| 6,563,174 | B2 | 5/2003 | Kawasaki et al. |
| 6,576,943 | B1 | 6/2003 | Ishii et al. |
| 6,727,522 | B1 | 4/2004 | Kawasaki et al. |
| 6,873,009 | B2 | 3/2005 | Hisamoto et al. |
| 6,876,023 | B2 | 4/2005 | Ishii et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,866 | B2 | 9/2006 | Nause et al. |
| 7,211,825 | B2 | 5/2007 | Shih et al |

(Continued)

FOREIGN PATENT DOCUMENTS

| | | |
|---|---|---|
| CN | 1146605 A | 4/1997 |
| CN | 1853278 A | 10/2006 |

(Continued)

OTHER PUBLICATIONS

International Search Report, PCT Application No. PCT/JP2011/054424, dated May 17, 2011, 4 pages.

(Continued)

*Primary Examiner* — Phat X Cao
(74) *Attorney, Agent, or Firm* — Fish & Richardson P.C.

(57) ABSTRACT

A semiconductor device is formed using a material which allows a sufficient reduction in off-state current of a transistor; for example, an oxide semiconductor material, which is a wide-gap semiconductor, is used. When a semiconductor material which allows a sufficient reduction in off-state current of a transistor is used, the semiconductor device can hold data for a long time. Transistors each including an oxide semiconductor in memory cells of the semiconductor device are connected in series; thus, a source electrode of the transistor including an oxide semiconductor in the memory cell and a drain electrode of the transistor including an oxide semiconductor in the adjacent memory cell can be connected to each other. Therefore, the area occupied by the memory cells can be reduced.

14 Claims, 13 Drawing Sheets

(56) References Cited

U.S. PATENT DOCUMENTS

| | | |
|---|---|---|
| 7,262,463 B2 | 8/2007 | Hoffman |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,564,055 B2 | 7/2009 | Hoffman |
| 7,674,650 B2 | 3/2010 | Akimoto et al. |
| 7,732,819 B2 | 6/2010 | Akimoto et al. |
| 7,791,074 B2 | 9/2010 | Iwasaki |
| 7,935,582 B2 | 5/2011 | Iwasaki |
| 7,956,361 B2 | 6/2011 | Iwasaki |
| 8,400,817 B2 | 3/2013 | Yamazaki et al. |
| 8,450,783 B2 | 5/2013 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2003/0227041 A1 | 12/2003 | Atwood et al. |
| 2004/0038446 A1 | 2/2004 | Takeda et al. |
| 2004/0127038 A1 | 7/2004 | Carcia et al. |
| 2004/0164326 A1 | 8/2004 | Atwood et al. |
| 2005/0017244 A1 | 1/2005 | Hoffman et al. |
| 2005/0017302 A1 | 1/2005 | Hoffman |
| 2005/0199959 A1 | 9/2005 | Chiang et al. |
| 2005/0205921 A1 | 9/2005 | Ishii et al. |
| 2005/0237786 A1 | 10/2005 | Atwood et al. |
| 2006/0035452 A1 | 2/2006 | Carcia et al. |
| 2006/0043377 A1 | 3/2006 | Hoffman et al. |
| 2006/0054977 A1* | 3/2006 | Somasekhar et al. ......... 257/390 |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0267699 A1 | 11/2007 | Hoffman |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Covan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2010/0276689 A1 | 11/2010 | Iwasaki |
| 2010/0279462 A1 | 11/2010 | Iwasaki |
| 2011/0198593 A1 | 8/2011 | Kato et al. |

FOREIGN PATENT DOCUMENTS

| | | |
|---|---|---|
| CN | 1906770 A | 1/2007 |
| CN | 101258607 A | 9/2008 |
| CN | 101859711 A | 10/2010 |
| EP | 1 737 044 A1 | 12/2006 |
| EP | 2 226 847 A2 | 9/2010 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 08-330445 A | 12/1996 |
| JP | 11-505377 A | 5/1999 |
| JP | 2000-044236 A | 2/2000 |
| JP | 2000-150900 A | 5/2000 |
| JP | 2000-269457 A | 9/2000 |
| JP | 2001-028443 A | 1/2001 |
| JP | 2001-053167 A | 2/2001 |
| JP | 2002-076356 A | 3/2002 |
| JP | 2002-289859 A | 10/2002 |
| JP | 2002-368226 A | 12/2002 |
| JP | 2003-086000 A | 3/2003 |
| JP | 2003-086808 A | 3/2003 |
| JP | 2004-014094 A | 1/2004 |
| JP | 2004-103957 A | 4/2004 |
| JP | 2004-273614 A | 9/2004 |
| JP | 2004-273732 A | 9/2004 |
| JP | 2006-528843 A | 12/2006 |
| JP | 2007-103918 A | 4/2007 |
| JP | 2007-519256 A | 7/2007 |
| JP | 2010-183108 A | 8/2010 |
| KR | 147352 B | 8/1998 |
| KR | 2006-0066064 A | 6/2006 |
| KR | 2006-0132659 A | 12/2006 |
| KR | 2008-0053355 A | 6/2008 |
| WO | 00/55920 A1 | 9/2000 |
| WO | 2004/114391 A1 | 12/2004 |
| WO | 2005/015643 A1 | 2/2005 |
| WO | 2005/074038 A1 | 8/2005 |
| WO | 2007/029844 A1 | 3/2007 |

(56) References Cited

OTHER PUBLICATIONS

Written Opinion, PCT Application No. PCT/JP2011/054424, dated May 17, 2011, 5 pages.
Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.
Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.
Clark, S et al., "First Principles Methods Using CASTEP," Zeitschrift fur Kristallographie, 2005, vol. 220, pp. 567-570.
Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.
Godo, H. et al., "Temperature Dependence of Characteristics and Electronics Structure for Amorphous In—Ga—Zn—Oxide TFT," AM-FPD '09 Digest of Technical Papers, Jul. 1, 2009, pp. 41-44.
Hayashi, R et al., "42.1: Invited Paper: Improved Amorphous In-—Ga—Zn—O TFTs," SID Digest '08 : SID International Symposium Digest of Technical Papers, May 20, 2008, vol. 39, pp. 621-624.
Hirao, T et al., "Novel Top-Gate Zinc Oxide Thin-Film Transistors (ZnO TFTs) for AMLCDS," Journal of the SID , 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper: Transparent Amorphous Oxide Semiconductors for High Performance TFT," SID Digest '07: SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.
Ikeda., T et al., "Full-Functional System Liquid Crystal Display Using CG-Silicon Technology," SID Digest '04: SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancles In ZnO," Appl. Phys. Lett. (Applied Physics Letters), 2005, vol. 87, pp. 122102-1-122102-3.
Jeong, J et al., "3.1: Distinguished Paper. 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.
Jin, D et al., "65.2: Distinguished Paper: World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing $MOO_3$ as a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.
Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases,", Nature Materials, Sep. 1, 2002, vol. 1, pp. 64-68.
Kim, S et al., "High-Performance oxide thin film transistors passivated by various gas plasmas," The Electrochemical Society, 214th ECS Meeting, 2008, No. 2317, 1 page.
Kimizuka, N et al., "Spinel,$YBFE_2O_4$, and $YB_2FE_3O_7$ Types of Structures for Compounds in the $IN_2O_3$ and $SC_2O_3$-$A_2O_3$-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.
Kimizuka, N et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—ZnO System," Journal of Solid State Chemistry, Apr. 1, 1995, vol. 116, No. 1, pp. 170-178.
Kitzerow, H et al., "Observation of Blue Phases in Chiral Networks," Liquid Crystals, 1993, vol. 14, No. 3, pp. 911-916.
Kurokawa, Y et al., "UHF RFCPUS on Flexible and Glass Substrates for Secure RFID Systems," Journal of Solid-State Circuits, 2008, vol. 43, No. 1, pp. 292-299.
Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Lee, H et al., "Current status of, challenges to, and perspective view of AM-OLED," IDW '06 : Proceedings of the 13th International Display Workshops, Dec. 7, 2006, pp. 663-666.
Lee, J et al., "World's Largest (15-Inch) XGA AMLCD Panel using IGZO Oxide TFT," SID Digest '08 : SID International Symposium Digest of Technical Papers, May 20, 2008, vol. 39, pp. 625-628.
Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.
Li, C et al., "Modulated Structures of Homologous Compounds $InMO_3(ZnO)m$ (M=In,Ga; m=Integer) Described by Four-Dimensional Superspace Group," Journal of Solid State Chemistry, 1998, vol. 139, pp. 347-355.
Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Meiboom, S et al., "Theory of the Blue Phase of Cholesteric Liquid Crystals," Phys. Rev. Lett. (Physical Review Letters), May 4, 1981, vol. 46, No. 18, pp. 1216-1219.
Miyasaka, M, "SUFTLA Flexible Microelectronics on Their Way to Business," SID Digest '07 : SID International Symposium Digest of Technical Papers, 2007, vol. 38, pp. 1673-1676.
Mo, Y et al., "Amorphous Oxide TFT Backplanes for Large Size AMOLED Displays," IDW '08 : Proceedings of the 6th International Display Workshops, Dec. 3, 2008, pp. 581-584.

(56) References Cited

OTHER PUBLICATIONS

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system of 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn—Oxide TFTs with a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09 : Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-in. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of The 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van de Walle, C, "Hydrogen as a Cause of Doping in Zinc Oxide," Phys. Rev. Lett. (Physical Review Letters), Jul. 31, 2000, vol. 85, No. 5, pp. 1012-1015.

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

Kim, W et al., "An Experimental High-Density DRAM Cell with a Built-in Gain Stage," IEEE Journal of Solid-State Circuits, Aug. 1, 1994, vol. 29, No. 8, pp. 978-981.

Shukuri, S et al., "A Complementary Gain Cell Technology for Sub-1 V Supply DRAMs," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.

\* cited by examiner

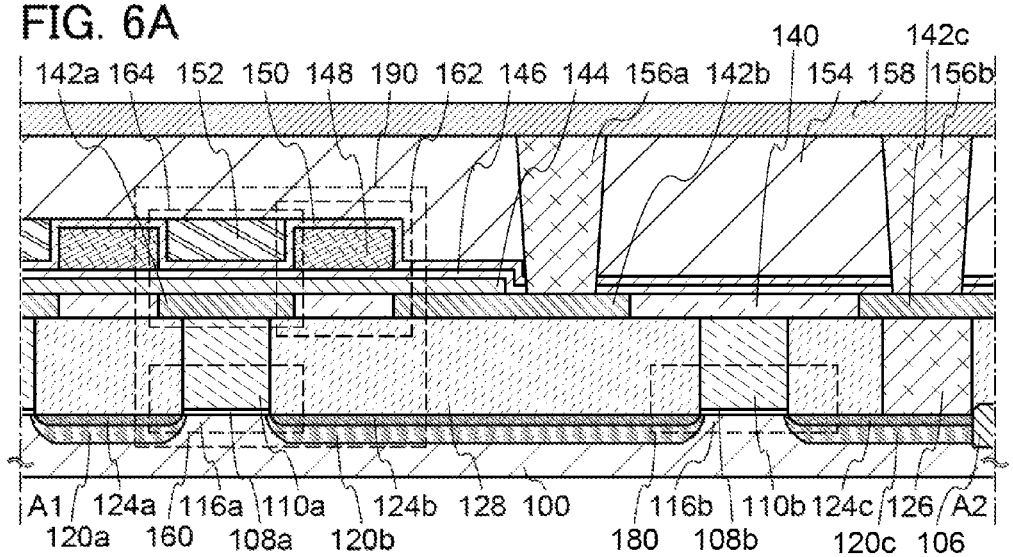
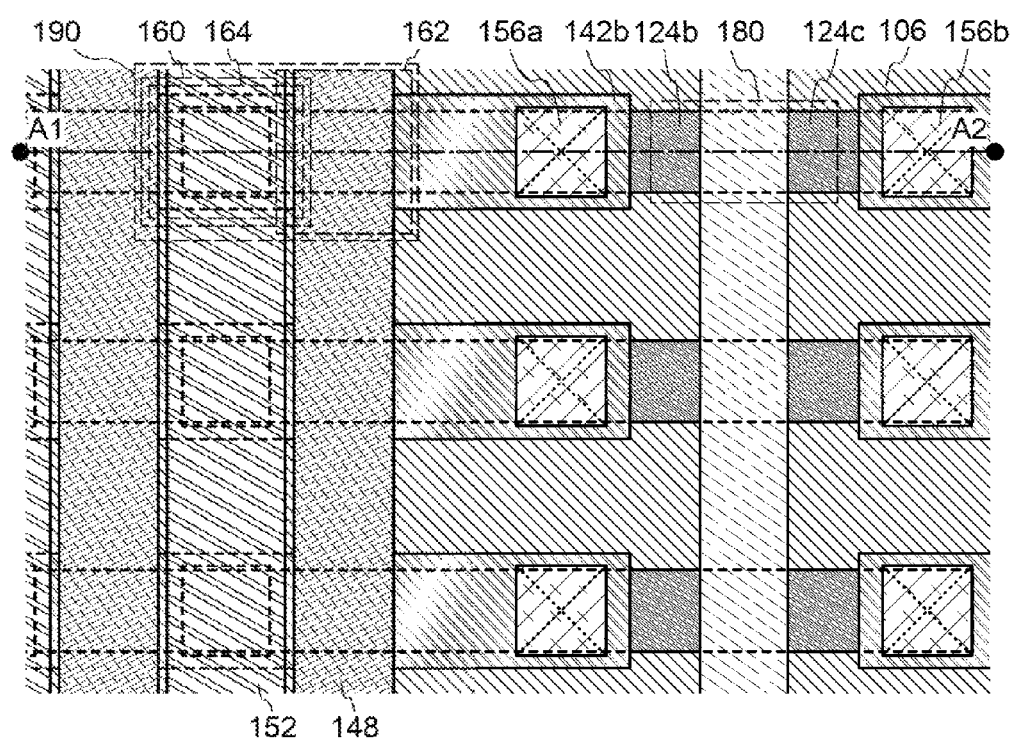

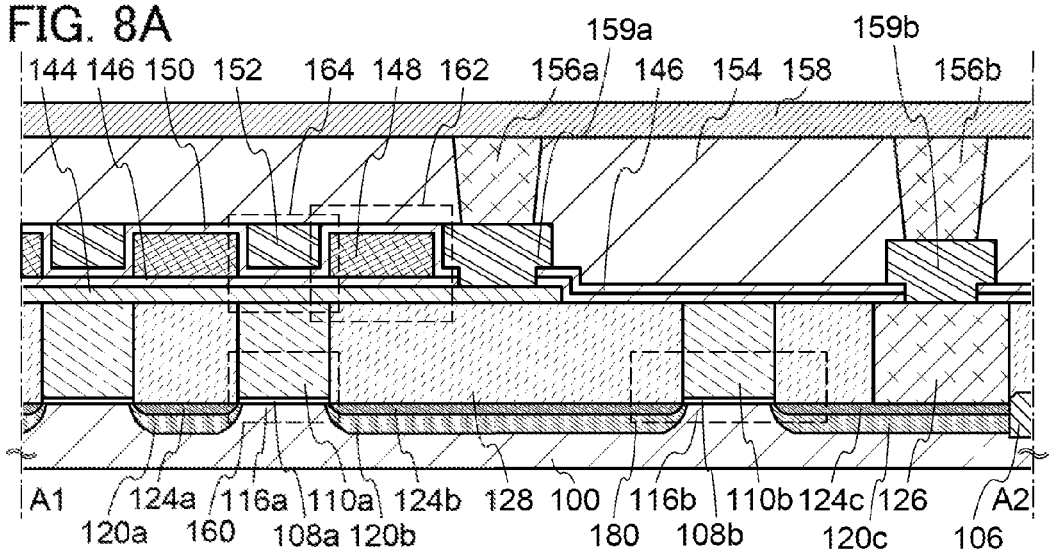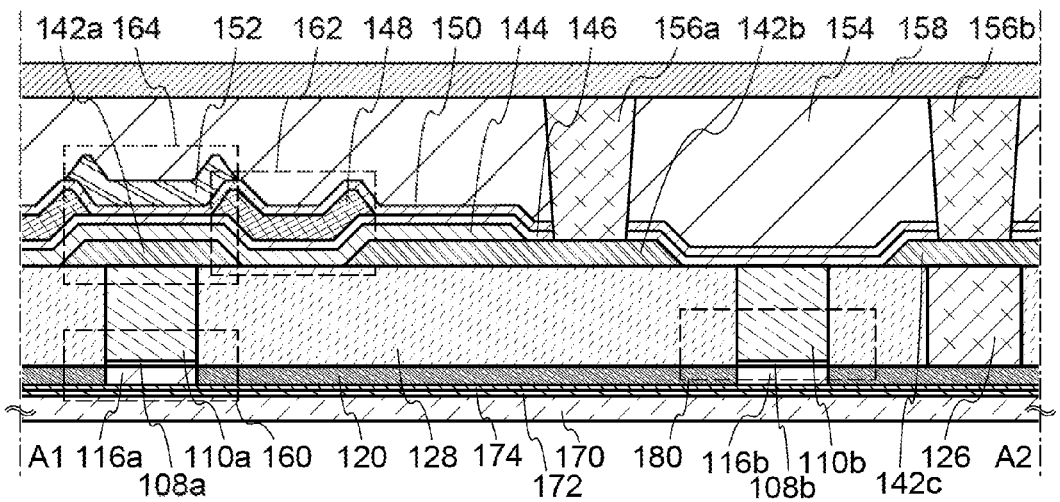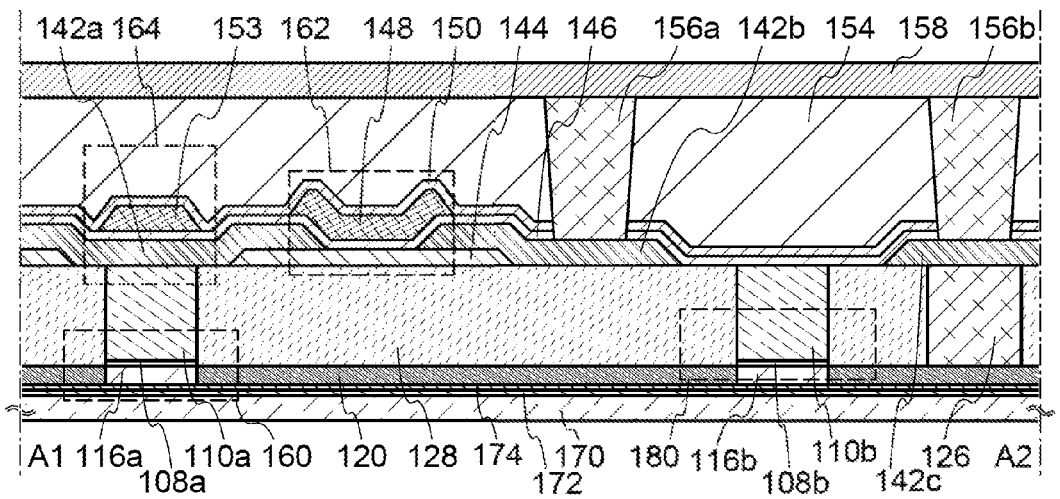

SEMICONDUCTOR DEVICE AND DRIVING METHOD OF SEMICONDUCTOR DEVICE

TECHNICAL FIELD

The disclosed invention relates to a semiconductor device including a semiconductor element and a driving method of the semiconductor device.

BACKGROUND ART

Memory devices using semiconductor elements are broadly classified into two categories: a volatile device that loses stored data when not powered, and a non-volatile device that holds stored data even when not powered.

A typical example of a volatile memory device is a dynamic random access memory (DRAM). A DRAM stores data in such a manner that a transistor included in a memory element is selected and charge is accumulated in a capacitor.

Owing to the above principle, charge in the capacitor is lost when data in a DRAM is read out; thus, another writing operation is necessary every time data is read out. Moreover, since leakage current (off-state current) flows between a source and a drain of a transistor included in a memory element when the transistor is in an off state, charge flows into or out of the transistor even if the transistor is not selected, which makes a data holding period short. For that reason, another writing operation (refresh operation) is necessary at predetermined intervals, and it is difficult to adequately reduce power consumption. Furthermore, since stored data is lost when power supply stops, another memory device utilizing a magnetic material or an optical material is needed in order to hold the data for a long time.

Another example of a volatile memory device is a static random access memory (SRAM). An SRAM holds stored data by using a circuit such as a flip-flop and thus does not need refresh operation, which is an advantage over a DRAM. However, cost per storage capacity is increased because a circuit such as a flip-flop is used. Moreover, as in a DRAM, stored data in an SRAM is lost when power supply stops.

A typical example of a non-volatile memory device is a flash memory. A flash memory includes a floating gate between a gate electrode and a channel formation region in a transistor and stores data by holding charge in the floating gate. Therefore, a flash memory has advantages in that the data holding period is extremely long (semi-permanent) and refresh operation which is necessary in a volatile memory device is not needed (e.g., see Patent Document 1).

However, in a flash memory, there is a problem in that a memory element does not function after a predetermined number of writing operations because a gate insulating layer included in the memory element deteriorates due to tunneling current generated in writing operations. In order to reduce effects of this problem, a method in which the number of writing operations is equalized, among the memory elements can be employed, for example, but a complicated peripheral circuit is needed to employ this method. Moreover, even when such a method is employed, the fundamental problem about the lifetime is not resolved. In other words, a flash memory is not suitable for applications in which data is frequently rewritten.

In addition, high voltage is necessary for holding charge in the floating gate or removing the charge, and a circuit therefor is required. Further, it takes a relatively long time to inject or remove charge, and it is not easy to increase a speed of writing and erasing data.

[Reference]
[Patent Document]
[Patent Document 1] Japanese Published Patent Application No. S57-105889

DISCLOSURE OF INVENTION

In view of the foregoing problems, an object of one embodiment of the disclosed invention is to provide a semiconductor device having a novel structure in which stored data can be held even when power is not supplied and in which the number of times of writing is not limited. Further, another object is to increase the degree of integration of the semiconductor device having the novel structure and increase the storage capacity per unit area.

In one embodiment of the disclosed invention, a semiconductor device is formed using a material which allows a sufficient reduction in off-state current of a transistor; for example, an oxide semiconductor material, which is a wide-gap semiconductor, is used. When a semiconductor material which allows a sufficient reduction in off-state current of a transistor is used, the semiconductor device can hold data for a long time.

In one embodiment of the disclosed invention, transistors each including an oxide semiconductor in memory cells of a semiconductor device are connected in series; thus, a source electrode of the transistor including an oxide semiconductor in the memory cell and a drain, electrode of the transistor including an oxide semiconductor in the adjacent memory cell can be connected to each other. On the other hand, in the case where transistors each including an oxide semiconductor in memory cells are connected in parallel, in each memory cell, one of a source electrode and a drain electrode of the transistor including an oxide semiconductor needs to be connected to a wiring through an opening. Therefore, when the transistors each including an oxide semiconductor in the memory cells of the semiconductor device are connected in series, the area occupied by the memory cells can be reduced than that in a structure in which the transistors each, including an oxide semiconductor are connected in parallel.

One embodiment of the disclosed invention is a semiconductor device including a source line; a bit line; m (m is an integer greater than or equal to 2) signal lines; m word lines; a selection line; first to m-th memory cells connected in series between the source line and the hit line; and a selection transistor whose gate terminal is electrically connected to the selection line. The first to m-th memory cells each include a first transistor including a first gate terminal, a first source terminal, and a first drain terminal; a second transistor including a second gate terminal, a second source terminal, and a second drain terminal; and a capacitor. The first transistor is provided over a substrate including a semiconductor material. The second transistor includes an oxide semiconductor layer. The source line is electrically connected to the first source terminal in the m-th memory cell through the selection transistor. The bit line is electrically connected to the second drain terminal in the first memory cell and is electrically connected to the first drain terminal in the first memory cell. The k-th (k is a natural number greater than or equal to 1 and less than or equal to m) signal line is electrically connected to the second gate terminal in the k-th memory cell. The k-th word line is electrically connected to one terminal of the capacitor in the k-th memory cell. The second drain terminal in the l-th (l is a natural number greater than or equal to 2 and less than or equal to m) memory cell is electrically connected to the first gate terminal in the (l–1)-th memory cell, the second source terminal in the (l–1)-th memory cell and the other terminal of the capacitor in the (l−1)-th memory cell. The first gate terminal in the m-th memory cell, the second source terminal in the m-th memory cell, and the other terminal of the capacitor in the m-th memory cell are electrically connected to one another. The first drain terminal in the l-th memory cell is electrically connected to the first source terminal in the (l−1)-th memory cell.

Another embodiment of the disclosed invention is a semiconductor device including a source line; a bit line; m (m is an integer greater than or equal to 2) signal lines; m word lines; a first selection line; a second selection line; first to m-th memory cells connected in series between the source line and the bit line; a first selection transistor whose gate terminal is electrically connected to the first selection line; and a second selection transistor whose gate terminal is electrically connected to the second selection line. The first to m-th memory cells each include a first transistor including a first gate terminal, a first source terminal, and a first drain terminal; a second transistor including a second gate terminal, a second source terminal, and a second drain terminal; and a capacitor. The first transistor is provided over a substrate including a semiconductor material. The second transistor includes an oxide semiconductor layer. The source line is electrically connected to the first source terminal in the m-th memory cell through the second selection transistor. The bit line is electrically connected to the second drain terminal in the first memory cell and is electrically connected to the first drain terminal m the first memory cell through the first selection transistor. The k-th (k is a natural number greater than or equal to 1 and less than or equal to m) signal line is electrically connected to the second gate terminal in the k-th memory cell. The k-th word line is electrically connected to one terminal of the capacitor in the k-th memory cell. The second drain terminal in the l-th (l is a natural number greater than or equal to 2 and less than or equal to m) memory cell is electrically connected to the first, gate terminal in the (l−1)-th memory cell, the second, source terminal in the (l−1)-th. memory cell, and the other terminal of the capacitor in the (l−1)-th memory cell. The first gate terminal in the m-th memory cell, the second source terminal in the m-th memory cell, and the other terminal of the capacitor in the m-th memory cell, are electrically connected to one another. The first drain terminal in the l-th memory cell, is electrically connected to the first source terminal in the (l−1)-th memory cell.

Note that the first transistor includes a channel formation region provided over the substrate including the semiconductor material; impurity regions provided so that the channel formation region is sandwiched between the imparity regions; a first gate insulating layer over the channel, formation region; and a first gate electrode provided over the first gate insulating layer so as to overlap with the channel formation region. The second transistor includes a second source electrode and a second drain electrode which are electrically connected to the oxide semiconductor layer; a second gate electrode provided so as to overlap with the oxide semiconductor layer; and a second gate insulating layer provided between the oxide semiconductor layer and the second gate electrode.

Note that the second drain electrode in the l-th memory cell and the second source electrode in the (l−1)-th memory cell are formed from the same conductive layer. Alternatively, the second drain electrode in the l-th memory cell, the second source electrode in the (l−1)-th memory cell, and the first gate electrode in the (l−1)-th. memory cell are fanned from the same conductive layer.

Note that the substrate including the semiconductor material is preferably a single crystal semiconductor substrate or an SOI substrate. The semiconductor material included in the substrate is preferably silicon. he oxide semiconductor layer preferably includes an oxide semiconductor material containing In, Ga, and Zn.

Note that although the transistor may be formed using an oxide semiconductor in the above description, the disclosed invention is not limited to this. A material with which the off-state current characteristics equivalent to those of the oxide semiconductor can be achieved, such as a wide gap material like silicon carbide (specifically, a semiconductor material whose energy gap $E_g$ is larger than 3 eV) may be used.

Note that in this specification and the like, the term such as "over" or "below" does not necessarily mean that a component is placed "directly on" or "directly under" another component. For example, the expression "a gate electrode over a gate insulating layer" does not exclude the case where another component is provided between the gate insulating layer and the gate electrode.

In addition, in this specification and the like, the term such as "electrode" or "wiring" does not limit a function of a component. For example, an "electrode" is sometimes used as part of a "wiring", and vice versa. Further, the term "electrode" or "wiring" can include the case where a plurality of "electrodes" or "wirings" are loaned in an integrated manner.

Further, functions of a "source" and a "drain" are sometimes interchanged with each other when a transistor of opposite polarity is used or when the direction of current flow is changed in circuit operation, for example. Therefore, the terms "source" and "drain" can be interchanged in this specification.

Note that in this specification and the like, the term "electrically connected" includes the case where components are connected through an object having any electric function. There is no particular limitation on the object having any electric function as long as electric signals can be transmitted and received between the components connected through the object. Examples of the object having any electric function include a switching element such as a transistor, a resistor, an inductor, a capacitor, and an element with a variety of functions as well as an electrode and a wiring, Since the off-state current of a transistor including an oxide semiconductor is extremely small, stored data can be held for an extremely long time by using the transistor. In other words, refresh operation becomes unnecessary or the frequency of the refresh operation can be extremely low, which leads to a sufficient reduction in power consumption. Moreover, stored data can be held for a long time even when power is not supplied (note that a potential is preferably fixed).

Further, a semiconductor device according to the disclosed invention does not need high voltage for writing data, and deterioration of the element does not become a problem. For example, unlike a conventional non-volatile memory, it is not necessary to inject and extract electrons into and from a floating gate, and thus a problem such as deterioration of a gate insulating layer due to injection and extraction of electrons does not occur at all. That is, the semiconductor device according to the disclosed invention does not have a limit on the number of times of rewriting, which has been a problem of a conventional non-volatile memory, and thus has drastically improved reliability. Furthermore, since data is written by aiming on or off the transistor, high-speed operation can be easily realized.

Since a transistor including a material other than an oxide semiconductor can operate at sufficiently high speed, when it is combined with a transistor including an oxide semiconductor, a semiconductor device can perform operation (e.g., reading data) at sufficiently high, speed. Further, a transistor including a material other than an oxide semiconductor can suitably realize a variety of circuits (e.g., a logic circuit or a driver circuit) which need to operate at high speed.

Thus, a semiconductor device having a novel feature can be realized by being provided with both the transistor including a material other than an oxide semiconductor (a transistor capable of operation at sufficiently high speed, in general) and the transistor including an oxide semiconductor (a transistor whose off-state current is sufficiently small, in general).

In a semiconductor device according to the disclosed invention, transistors each including an oxide semiconductor in memory cells of the semiconductor device are connected in series; thus, a source electrode of the transistor including an oxide semiconductor in the memory cell and a drain electrode of the transistor including an oxide semiconductor in the adjacent memory cell can be connected to each other. That is, in each memory cell, one of the source electrode and the drain electrode of the transistor including an oxide semiconductor does not need to be connected to a wiring through an opening. Therefore, the area occupied by the memory cells can be reduced, whereby the degree of integration of the semiconductor device can be increased and the storage capacity per unit area can be increased.

BRIEF DESCRIPTION OF DRAWINGS

FIGS. 6A and 6B are a cross-sectional view and a plan view of a semiconductor device.
FIGS. 8A to 8C are each a cross-sectional view of a semiconductor device.

BEST MODE FOR CARRYING OUT THE INVENTION

Figure 1A:
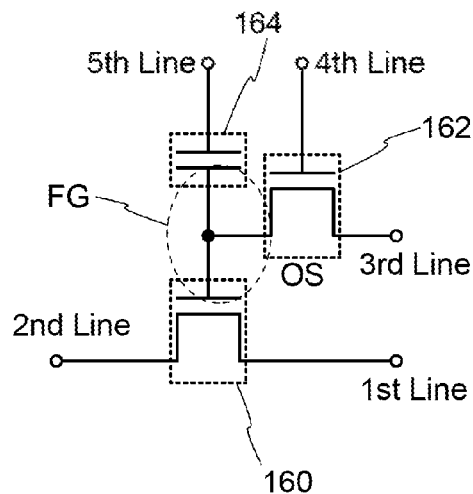
FIGS. 1A to 1C are circuit diagrams of semiconductor devices.

Hereinafter, embodiments of the disclosed invention are described with reference to the drawings. Note that the present invention is not limited to the following description and it will be readily appreciated by those skilled in the art that modes and details can be modified in various ways without departing from the spirit and the scope of the present invention. Accordingly; the present invention should not be construed as being limited to the description; of the embodiments to be given below.

Note that the position, the size, the range, or the like of each structure illustrated in drawings and the like is not accurately represented in some cases for easy understanding. The disclosed invention is thus not necessarily limited by the position, size, range, or the like illustrated in the drawings and the like.

In this specification and the like, ordinal numbers such as first, second, and third are used in order to avoid confusion among components, and the terms do not limit the components numerically.

[Embodiment 1]

In this embodiment, a circuit structure and operation of a semiconductor device according to one embodiment of the disclosed invention, will be described with reference to FIGS. 1A to 1C, FIG. 2, FIG. 3, FIG. 4, and FIG. 5. Note that in each of the circuit diagrams, "OS" may be written, beside a transistor in order to indicate that the transistor includes an oxide semiconductor.

<Base Circuit>

First, the basic circuit structure and its operation will be described with reference to FIGS. 1A to 1C. In the semiconductor device in FIG. 1A, a first wiring (a 1st line) and a source electrode (or a drain electrode) of a transistor 160 are electrically connected to each other, and a second wiring (a 2nd line) and the drain electrode (or the source electrode) of the transistor 160 are electrically connected to each other. In addition, a third wiring (a 3rd line) and a source electrode (or a drain electrode) of a transistor 162 are electrically connected to each other, and a fourth wiring (a 4th line) and a gate electrode of the transistor 162 are electrically connected to each other. In addition, a gate electrode of the transistor 160 and the drain electrode (or the source electrode) of the transistor 162 are electrically connected to one electrode of a capacitor 164, and a fifth wiring (a 5th line) and the other electrode of the capacitor 164 are electrically connected to each other.

Here, a transistor including an oxide semiconductor is used as the transistor 162, for example. Off-state current of a transistor including an oxide semiconductor is extremely small. Therefore, when the transistor 162 is in an off state, a potential in the gate electrode of the transistor 160 can be held for a very long time. The capacitor 164 facilitates holding of charge applied to die gate electrode of the transistor 160 and reading of the held data.

Note that there is no particular limitation on the transistor 160. In order to increase the speed of reading data, it is preferable to use, for example, a transistor with high switching speed, such as a transistor formed using single crystal silicon.

Figure 1B:
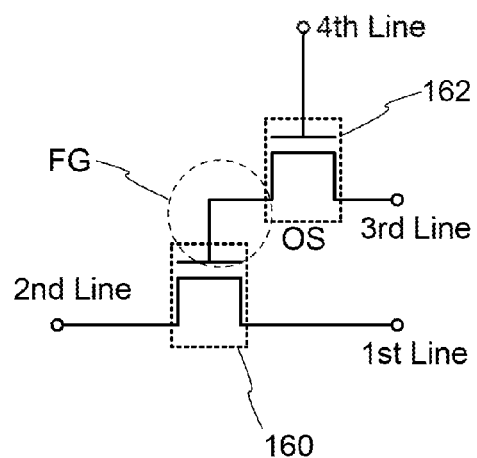

Alternatively, the capacitor 164 may be omitted as in FIG. 1B.

The semiconductor device in FIG. 1A can write, hold, and read data as described below, utilizing a characteristic in which the potential of the gate electrode of the transistor 160 can beheld.

Firstly, writing and holding of data will be described. The potential of the fourth wiring is set to a potential at which the transistor 162 is turned on, whereby the transistor 162 is turned on. Thus, the potential of the third wiring is applied to the gate electrode of the transistor 160 and the capacitor 164. That is, predetermined charge is applied to the gate electrode of the transistor 160 (writing of data). Here, charge for applying either two different levels of potential (hereinafter charge for applying a low potential is referred to as charge $Q_L$ and charge for applying a high potential is referred to as charge $Q_H$) is applied. Note that charge for applying three or more different levels of potential may be employed to improve storage capacity. After that, the potential of the fourth wiring is set to a potential at which the transistor 162 is turned off, whereby the transistor 162 is turned off. Thus, the charge applied to the gate electrode of the transistor 160 is held (holding of data).

Since the off-state current of the transistor 162 is extremely small, the charge in the gate electrode of the transistor 160 is held for a long time.

Secondly, reading of data will be described. While a predetermined potential (a fixed potential) is applied to the first wiring, an appropriate potential (a read-out potential) is applied to the fifth wiring, whereby the potential of the second wiring changes depending on the amount of charge held in the gate electrode of die transistor 160. This is because in general, when the transistor 160 is an n-channel transistor, an apparent threshold value $V_{th\_H}$ in the case where $Q_H$ is held in the gate electrode of the transistor 160 is lower man an apparent threshold value $V_{th\_L}$ in the case where $Q_L$ is held in the gate electrode of the transistor 160. Here, an apparent threshold value refers to the potential of the fifth wiring which is needed to turn on the transistor 160. Thus, by setting the potential of the fifth wiring to a potential $V_O$ which is between $V_{th\_H}$ and $V_{th\_L}$, charge held in the gate electrode of the transistor 160 can be determined. For example, in the case where $Q_H$ is applied in writing, when the potential of the fifth wiring is set to $V_O$ ($>V_{th\_H}$), the transistor 160 is turned on. In the case where $Q_L$ is applied in writing, even when the potential of the fifth wiring is set to $V_O$ ($<V_{th\_L}$), the transistor 160 remains off. Thus, the data held can be read by measuring the potential of the second wiring.

Note that in the case where memory cells are arrayed, it is necessary to read out data only from an intended memory cell. Thus, in order that data of a predetermined memory cell is read and data of the other memory cells is not read, in the case where the transistors 160 are connected in parallel between the memory cells, a potential which allows the transistor 160 to be turned off regardless of a state of the gate electrode, that is, a potential lower than $V_{th\_H}$ may be supplied, to fifth wirings of the memory cells whose data Is not to be read. Further, in the ease where the transistors 160 are connected in series between the memory cells, a potential which allows the transistor 160 to be turned on regardless of a state of the gate electrode, that is, a potential higher than $V_{th\_L}$ may be supplied to fifth wirings of the memory cells whose data is not to be read.

Thirdly, rewriting of data will be described. Rewriting of data is performed in a manner similar to that of the writing and holding of data. In other words, the potential of the fourth wiring is set to a potential at which the transistor 162 is turned on, whereby the transistor 162 is turned on. Accordingly, the potential of the third wiring (a potential, for new data) is applied to the gate electrode of the transistor 160 and the capacitor 164. After that, the potential of the fourth wiring is set to a potential at which the transistor 162 is turned off, whereby the transistor 162 is turned off. Thus, charge for the new data is applied to the gate electrode of the transistor 160.

In the semiconductor device according to the disclosed invention, data can be directly rewritten by another writing of data as described above. Therefore, extracting of charge from a floating gate with the use of high voltage, which is needed in a flash memory or the like, is not needed and thus a reduction in operation speed caused by erasing operation can be suppressed. In other words, high-speed operation of the semiconductor device can be realized.

Note that the drain electrode (or the source electrode) of the transistor 162 is electrically connected to the gate electrode of the transistor 160, and thereby has an effect similar to that of a floating gate of a floating-gate transistor which is used as a non-volatile memory element. In the following description, the portion where the drain electrode (or the source electrode) of the transistor 162 and the gate electrode of the transistor 160 are electrically connected to each other is called a node FG in some cases. When the transistor 162 is off, the node FG can be regarded as being embedded in an insulator and charge is held in the node FG. The off-state current of the transistor 162 including an oxide semiconductor is smaller than or equal to one hundred thousandth of the off-state current of a transistor including a silicon semiconductor; thus, loss of the charge accumulated in the node FG due to leakage current of the transistor 162 is negligible. That is, with the transistor 162 including an oxide semiconductor, a non-volatile memory device which can hold data without power supply can be realized.

For example, when the off-state current of the transistor 162 is smaller than or equal to 10 zA (1 zA (zeptoampere) is $1 \times 10^{-21}$ A) at room temperature (25° C.) and the capacitance value of the capacitor 164 is approximately 10 fF, data can be held for $10^4$ seconds or longer. It should be appreciated that the holding time changes depending on the transistor characteristics and the capacitance value.

In the semiconductor device according to the disclosed invention, a problem of deterioration, of a gate insulating film, (a tunnel insulating film), which occurs in a conventional floating-gate transistor, does not exist. That is, deterioration of a gate insulating film due to injection of electrons into a floating gate, which has been regarded as a problem, can be solved. This means that there is no limitation on the number of times of writing in principle. In addition, high, voltage which is needed for writing or erasing data in a conventional floating-gate transistor is not necessary.

Figure 1C:
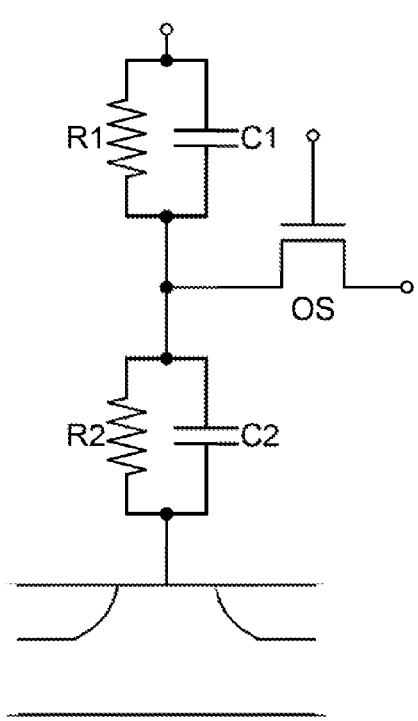

The components such as transistors in the semiconductor device in FIG. 1A can be regarded as including a resistor and a capacitor as shown in FIG. 1C. That is, in FIG. 1C, the transistor 160 and the capacitor 164 are each regarded as including a resistor and a capacitor. $R_1$ and $C_1$ denote the resistance value and the capacitance value of the capacitor 164, respectively. The resistance value $R_1$ corresponds to the resistance value of an insulating layer included in the capacitor 164. $R_2$ and $C_2$ denote the resistance value and the capacitance value of the transistor 160, respectively. The resistance value $R_2$ corresponds to the resistance value of a gate insulating layer at the time when the transistor 160 is on. The capacitance value $C_2$ corresponds to the capacitance value of so-called gate capacitance (capacitance between the gate electrode and the source electrode or drain electrode and capacitance between the gate electrode and the channel formation region).

A charge holding period (also referred to as a data holding period) is determined mainly by the off-state current of the transistor 162 under the condition where the gate leakage current of the transistor 162 is sufficiently small, $R_1$ is greater than or equal to $R_{OS}$, and $R_2$ is greater than or equal to $R_{OS}$, where $R_{OS}$ is the resistance value (also referred to as effective resistance) between the source electrode and the drain electrode at the time when the transistor 162 is off.

On the other hand, when the condition is not satisfied, it would be difficult to ensure a sufficient holding period even if the off-state current of the transistor 162 is small enough. This is because leakage current other than the off-state current of the transistor 162 (e.g., leakage current generated between the source electrode and the gate electrode in the transistor 160) would be large. Thus, it can be said that the semiconductor device disclosed in this embodiment desirably satisfies the relation where $R_1$ is greater than or equal to $R_{OS}$ and $R_2$ is greater than or equal to $R_{OS}$.

It is desirable that $C_1$ be greater than or equal to $C_2$. This is because by increasing $C_1$, the potential of the fifth wiring can be effectively applied to the node FG when the potential in the node FG is controlled by the fifth wiring, and thus the difference between, the potentials applied to the fifth wiring (e.g., a potential of reading and a potential of not reading) can be reduced.

As described above, when the above relation is satisfied, a more favorable semiconductor device can be realized. Note that $R_1$ and $R_2$ are determined by the gate insulating layer included in the transistor 160 and the insulating layer included in the capacitor 164, respectively. Similarly, $C_1$ and $C_2$ are determined by the gate insulating layer of the transistor 160 and the insulating layer included in the capacitor 164, respectively. Therefore, the material, the thickness, and the like of the gate insulating layer are desirably set as appropriate so that the above relation may be satisfied.

In the semiconductor device described in this embodiment, the node FG has an effect similar to a floating gate of a floating-gate transistor in a flash memory or the like, but the node FG of this embodiment has a feature which is essentially different, from that of the floating gate in the flash memory or the like.

In a flash memory, since a potential applied to a control gate is high, it is necessary to keep a proper distance between cells in order to prevent the potential from affecting a floating gate of the adjacent cell. This is one of the factors inhibiting high integration of the semiconductor device. The factor is due to a basic principle of a flash memory that tunneling current is generated by application of a high electric field.

In contrast, the semiconductor device according to this embodiment is operated by switching of a transistor including an oxide semiconductor and does not use the above principle of charge injection by tunneling current. That is, unlike a flash memory, a high electric field for charge injection is not necessary. Accordingly, an effect of a high electric field for a control gate on an adjacent cell does not need to be taken into account, and thus high integration can be facilitated.

In addition, it is also advantage over a flash memory that a high electric field is unnecessary and a large peripheral circuit (such, as a booster circuit) is unnecessary. For example, the maximum value of voltage applied to the memory cell according to this embodiment (the difference between the highest potential and the lowest potential applied to terminals of the memory cell at the same time) can be 5 V or lower, preferably 3 V or lower, in each memory cell in the case where two-level (one-bit) data is written.

In the case where the dielectric constant $\in_{x1}$ of the insulating layer included in the capacitor 164 is different from the dielectric constant $\in_{x2}$ of the insulating layer included in the transistor 160, $C_1$ and $C_2$ can easily satisfy $C_1 \geq C_2$ while $S_1$ which is the area of the insulating layer included in the capacitor 164 and $S_2$ which is the area of an insulating layer forming gate capacitance of the transistor 160 satisfy $2 \times S_2 \geq S_1$ (desirably $S_2 \geq S_1$). In other words, $C_1 \geq C_2$ can be easily satisfied while the area of the insulating layer included in the capacitor 164 is small Specifically, for example, when a film formed of a high-k material such as hafnium oxide or a stack of a film formed of a high-k material such as hafnium oxide and a film formed of an oxide semiconductor is used for the insulating layer included in the capacitor 164, $\in_{x1}$ can be set to 10 or more, preferably 15 or more, and when a film formed of silicon oxide is used for the insulating layer forming the gate capacitance, $\in_{x2}$ can be set to 3 to 4.

Combination of such structures enables higher integration of the semiconductor device according to the disclosed invention.

Note that in addition to the increase in the degree of integration, a multilevel technique can be employed in order to increase the storage capacity of the semiconductor device. For example, three or more levels of data are written, to one memory cell, whereby the storage capacity can be increased as compared to that in the case where two-level (one-bit) data is written. The multilevel technique can be achieved by, for example, giving charge Q to the gate electrode of the first transistor, in addition to charge $Q_L$ for supplying a low potential and charge $Q_H$ for supplying a high potential.

APPLICATION EXAMPLE

Next, a more specific circuit structure to which the circuit illustrated in FIGS. 1A to 1C is applied and an operation thereof will be described with reference to FIG. 2, FIG. 3, FIG. 4, and FIG. 5.

Figure 2:
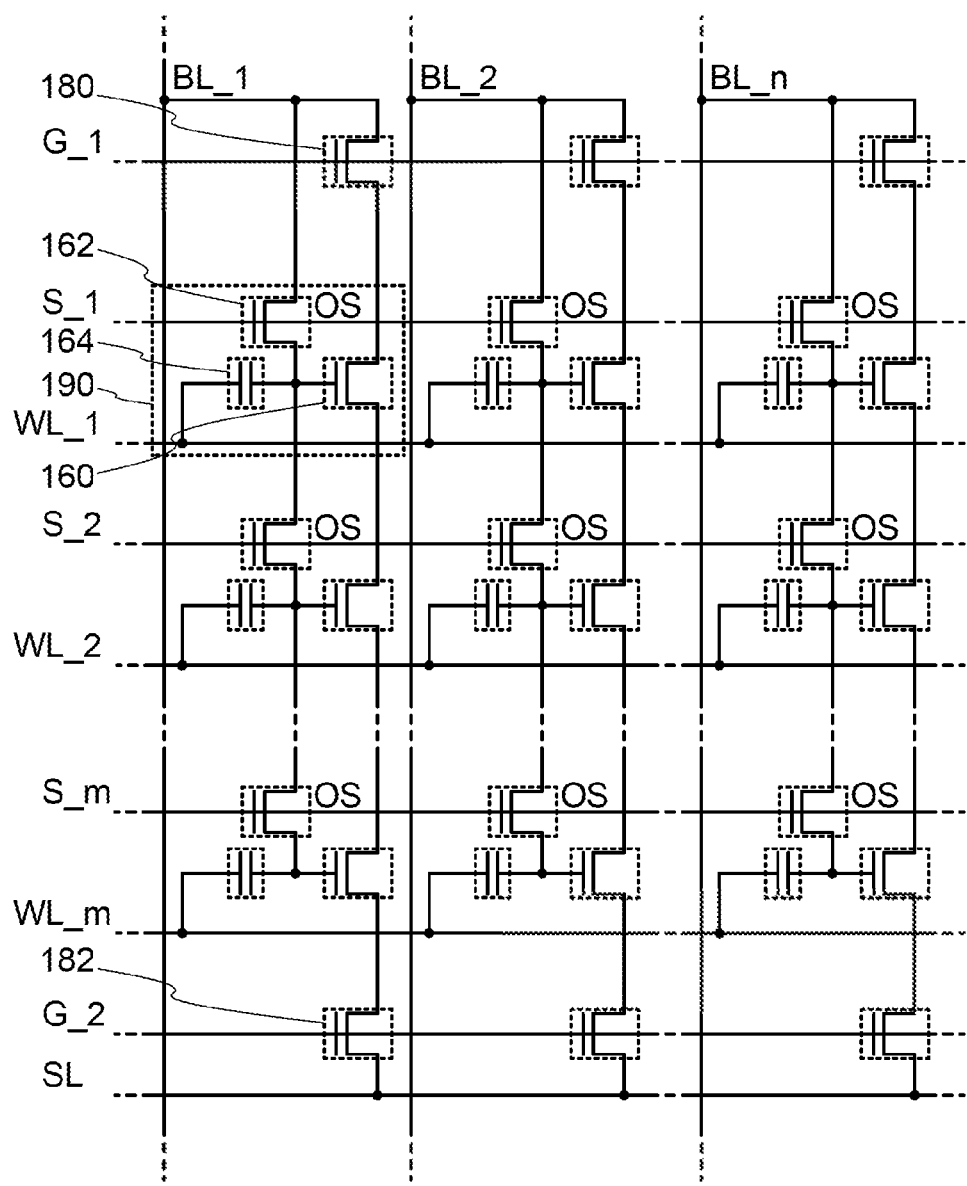
FIG. 2 is a circuit diagram of a semiconductor device.

FIG. 2 is an example of a circuit diagram of a semiconductor device including m (rows) (in a vertical direction)×n (columns) (in a horizontal direction) memory cells 190. The structure of the memory cells 190 in FIG. 2 is similar to that in FIG. 1A, That is, the first wiring and the third wiring in FIG. 1A correspond to a hit line BL in FIG. 2; the second wiring in FIG. 1A, a source line SL in FIG. 2; the fourth wiring in FIG. 1A, a signal line S in FIG. 2; and the fifth wiring in FIG. 1A, a word line WL in FIG. 2. Note that in FIG. 2, the memory cells 190 in a column direction are connected in series in such a manner that the transistors 162 are connected in series and the transistors 160 are connected in series; thus, only the memory cells 190 in the first row are connected to the hit lines BL not through other memory cells 190, and only the memory cells 190 in the m-th row are connected to the source line SL not through other memory cells 190. The memory cells 190 in the other rows are electrically connected to the bit lines BL and the source line SL through other memory cells 190 of the same columns.

The semiconductor device illustrated in FIG. 2 includes m (m is an integer greater than or equal to 2) word lines WL; m signal lines S; n (n is an integer greater than, or equal to 2) bit lines BL; a memory cell array having the memory cells 190 in a matrix of m (rows) (in the vertical direction)×n (columns) (in the horizontal direction); a source line SL; a selection line $G_{\_1}$ and a selection line $G_{\_2}$; n selection transistors 180 winch are arranged along the selection line $G_{\_1}$ and between the bit lines BL and the memory cells 190 in the first row and whose gate electrodes are electrically connected to the selection line $G_{\_1}$; and n selection transistors 182 which are arranged along the selection line $G_{\_2}$ and between the memory cells 190 in the m-th row and the source line SL and whose gate electrodes are electrically connected to the selection line $G_{\_2}$.

That is, the bit lines BL are electrically connected to the drain electrodes of the transistors 162 in the memory cells 190 in the first row, and are electrically connected to the drain electrodes of the transistors 160 in the memory cells 190 in the first row through the selection transistors 180. The source line SL is electrically connected to the source electrodes of the transistors 160 in the memory cells 190 in the m-th row through the selection transistors 182. The signal line S in the k-th row (k is a natural number greater than or equal to 1 and less than or equal to m) is electrically connected to the gate electrodes of the transistors 162 in the memory cells 190 in the k-th row. The word line WL in the k-th row is electrically connected to one electrode of each of the capacitors 164 in the memory cells 190 in the k-th row.

The drain electrode of the transistor 160 in the memory cell 190 in the l-th row (l is a natural number greater than or equal to 2 and less than or equal to m) is electrically connected to the source electrode of the transistor 160 in the memory cell 190 in the (l−1)-th row.

The drain electrode of the transistor 162 in the memory cell 190 in the l-th row is electrically connected to the gate electrode of the transistor 160, the source electrode of the transistor 162, and the other electrode of the capacitor 164 in the memory cell 190 in the (l−1)-th row. in the memory cell 190 in the m-th row, the gate electrode of the transistor 160, the source electrode of the transistor 162, and the other electrode of the capacitor 164 are electrically connected to one another. That is, in the semiconductor device illustrated in FIG. 2, the node FG in the memory cell 190 in the (l−1)-th row has the structure in FIG. 1A, and in addition, is electrically connected to the drain electrode of the transistor 162 in the memory cell 190 in the l-th row. Here, the transistors 162 each including an oxide semiconductor have significantly small off-state current in the l-th row and in the (l−1)-th row; thus, in the memory cell 190 in the semiconductor device illustrated in FIG. 2, the potential of the node FG can be held for a long time by turning off the transistor 162 as in the semiconductor device illustrated in FIG. 1A.

The transistors 162 in the memory cells 190 are connected in series as described above; thus, the source electrode of the transistor 162 in the memory cell 190 and the drain electrode of the transistor 162 in the adjacent memory cell 190 can be electrically connected to each other. Accordingly, only one of the source electrode and the drain electrode of the transistor 162 is included in each memory cell 190.

On the other hand, in the case where the transistors 162 in the memory cells 190 are connected in parallel and the source electrode and the drain electrode are provided for each of the transistors 162 in the memory cells 190, one of the source electrode and the drain electrode of the transistor 162 needs to be connected to a wiring such as the bit line BL through an opening. That is, both of the source electrode and the drain electrode of the transistor 162 and the opening for connection with the wiring are included in each memory cell 190.

Therefore, as illustrated in FIG. 2, the transistors 162 in the memory cells 190 are connected in series, whereby the area occupied by the memory cells 190 can be reduced. For example, when F is used to express the minimum feature size, the area occupied by the memory cell 190 can be $4F^2$ to $12F^2$. Accordingly, the degree of integration of the semiconductor device can be increased, and the storage capacity per unit area can be increased.

Figure 3:
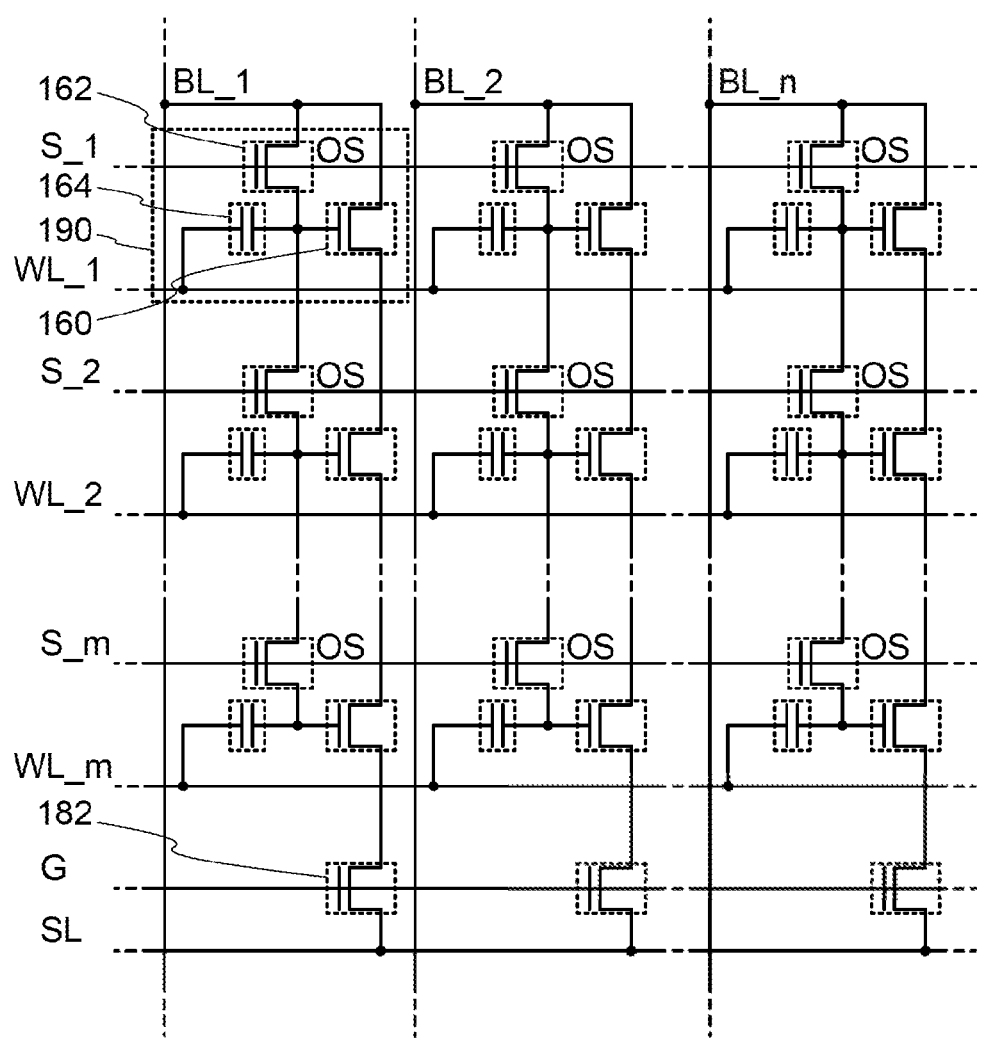
FIG. 3 is a circuit diagram of a semiconductor device.

Note that the selection line $G_{-1}$, the selection line $G_{-2}$, the selection transistors 180, and the selection transistors 182 are not necessarily provided. The selection line $G_{-1}$ and the selection transistors 180 may be omitted. Alternatively, the selection line $G_{-2}$ and the transistors 182 may be omitted. For example, as illustrated in FIG. 3, a structure may be employed in which only a selection line G corresponding to the selection line $G_{-2}$ and the selection transistors 182 are provided.

Data writing, holding, and reading are basically similar to those in the case of FIGS. 1A to 1C. Note that data writing is performed at least for each row, and is performed sequentially for rows. Here, it is preferable that data writing be sequentially performed from the memory cells 190 in the farthest row from the bit lines BL. This is because the node FG in the memory cell 190 is connected to the node FG in the adjacent memory cell 190 through the transistor 162, and it is difficult to perform writing operation for each memory cell 190. A specific writing operation is described below. Note that although the case where either a potential $V_2$ (a potential lower than a power supply potential $V_{DD}$) or a reference potential GND (also expressed, as 0 V) is supplied to the node FG is described here as an example, the relation among potentials supplied to the node FG is not limited to this example. Data that is held when the potential $V_2$ is supplied to the node FG is referred to as data "1", and data that is held when the reference potential GND is supplied to the node FG is referred to as data "0".

First, the potential of the selection line $G_{-1}$ is set to GND (0 V), the potential of the selection line $G_{-2}$ is set to $V_1$ (e.g., $V_{DD}$), and the potential of the signal line S connected to the memory cells 190 to which data is to be written is set to $V_3$ (a potential higher than $V_2$; for example, $V_{DD}$) so that the memory cells 190 are selected. Note that in the case where a different memory cell 190 is present between the memory cell 190 to which data is to be written and the bit line BL, the potential of the signal line S which is connected to the different memory cell 190 is set to $V_3$; thus, the potential of the bit line BL can be supplied to the memory cell 190 to which data is to be written.

In the case of writing data "0" to the memory cell 190, GND is supplied to the bit line BL, and in the case of writing data "1" to the memory cell 190, $V_2$ is supplied to the bit line BL. Because the potential of the signal line S is $V_3$ here, $V_2$ can be supplied to the node FG.

Data is held by setting the potential of the signal line S connected to the memory cells 190 in which data is to be held to GND. When the potential of the signal line S is fixed to GND, the potential of the node FG is fixed to the potential at the time of writing. In other words, when $V_2$ for data "1" is supplied to the node FG, the potential of the node FG is $V_2$, and when GND for data "0" is supplied to the node FG the potential of the node FG is GND.

Because GND is supplied to the signal line S, the transistor 162 is turned off regardless of whether data "1" or data "0" is written. Since the off-state current of the transistor 162 is significantly small, the charge of the gate electrode of the transistor 160 is held for a long time. Note that after the operation for holding data, data is written to the adjacent memory cells 190 (which are nearer to the bit lines BL). The details are described above.

Data is read by setting the potential of the word line WL connected to the memory cells 190 from which data is to be read to GND, setting the potentials of the word lines WL connected to the memory cells 190 from which data is not to be read to $V_5$ (e.g., $V_{DD}$), and setting the potentials of the selection line $G_{-1}$ and the selection line $G_{-2}$ to $V_1$.

When the potential of the word line WL connected to the memory cells 190 from which data is to be read is set to GND, the transistors 160 are turned on if $V_2$ for data "1" is supplied to the nodes FG of the memory cells 190 from which data is to be read. On the other hand, the transistors 160 are turned off if GND for data "0" is supplied to the nodes FG.

When the potentials of the word lines WL connected to the memory cells 190 from which data is not to be read are set to $V_5$, the transistors 160 are turned on regardless of whether data "1" or data "0" is written to the memory cells 190 from which data is not to be read.

Note that in the structure of FIG. 2, the transistors 162 included in the memory cells 190 are connected in series, so that it is difficult to rewrite only data in an arbitrary row. Therefore, operation for erasing data in a plurality of rows at once is preferably performed in the above driving method. For example, in the case where rows in which the transistors 162 are connected in series between the bit lines BL and the source line SL are regarded as one block, data erasing is preferably performed for each block. In the case where data in a predetermined block is rewritten, it is preferable that data in the block be erased, and then data writing be sequentially performed from the memory cells 190 in the farthest row from the bit lines BL. Note that in the case where data in a row on which writing has just been performed is rewritten, erasing operation is unnecessary.

Figure 4:
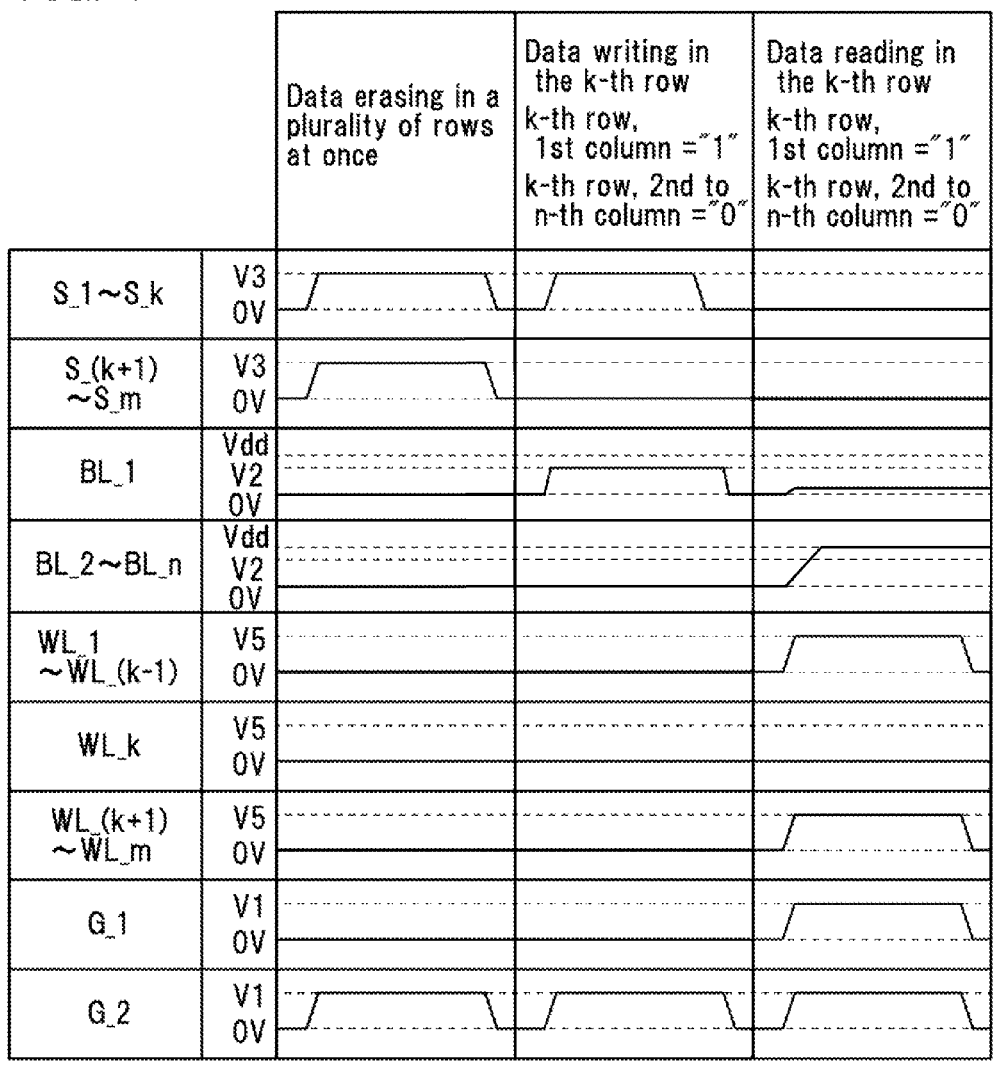
FIG. 4 is a timing chart.

FIG. 4 is an example of a timing chart for more detailed operations of the semiconductor device in FIG. 2. S, BL, and the like in the timing chart denote the lines to which the potentials in the timing chart are applied. Lines having a similar function are distinguished by "$_{\_1}$", "$_{\_13\_2}$", and the like added to the end of their names.

The timing chart in FIG. 4 shows the relation among the potentials of the lines in the case where data written to the memory cells in the first to m-th rows is erased (data erasing in a plurality of rows at once), in the case where data "1" is written to the memory cells in the k-th row and the first column and data "0" is written to the memory cells in the k-th row and the other columns (the second to n-th columns) (data writing in the k-th row), and in the case where data written, to the memory cells in the k-th row is read out (data reading in the k-th row). When data is read out, data "1" is stored in the memory cell in the k-th row and the first column and data "0" is stored in the memory cells in the k-th row and the other columns (the second to n-th columns).

When data is erased in a plurality of rows at once, the potential $V_3$ is supplied to the signal lines $S_{\_1}$ to $S_{\_m}$ so that the transistors 162 in the first to m-th rows are turned on, and the potentials of the bit lines $BL_{\_1}$ to $BL_{\_n}$ are set to GND so that the potentials of the nodes FG in the first to m-th rows are set to GND.

Note that the potential of the selection line $G_{\_1}$ is set to GND to turn off the selection transistors 180 and the selection line $G_{\_2}$ is supplied with the potential $V_1$ to turn on the selection transistors 182. Alternatively, the selection line $G_{\_1}$ may be supplied with the potential $V_1$.

When data is written in the k-th row, the potential $V_3$ is supplied to the signal lines $S_{\_1}$ to $S_k$ so that the transistors 162 in the first to k-th rows are turned on, and the potentials of the signal lines $S_{\_(k+1)}$ to $S_{\_m}$ are set to GND so that the transistors 162 in the (k+1)-th to m-th rows are turned off. The bit line $BL_{\_1}$ is supplied with the potential $V_2$, and the potentials of the bit lines $BL_{\_2}$ to $BL_{\_n}$ are set to GND.

Note that the potential of the selection line $G_{\_1}$ is set to GND so that the selection transistors 180 are turned off, and the selection line $G_{\_2}$ is supplied with the potential $V_1$ so that the selection transistors 182 are turned on. The potentials of the word lines $WL_{\_1}$ to $WL_{\_m}$ may be set to GND. The word lines $WL_{\_(k+1)}$ to $WL_{\_m}$ may be supplied with the potential $V_5$.

As a result, the node FG in the memory cell in the k-th row and the first column is supplied with the potential $V_2$. In other words, data "1" is written to the memory cell in the k-th row and the first column. Further, the nodes FG in the memory cells in the k-th row and the second to n-th columns are supplied, with 0 V. In other words, data "0" is written to the memory cells in the k-th row and the second to n-th columns.

In such a manner, in the semiconductor device described in this embodiment, when data is written to the memory cells 190 in the k-th row (it is a natural number greater than or equal to 1 and less than or equal to m), the transistors 162 in the first to k-th rows need to be turned on; therefore, data is preferably written to the memory cell array from the m-th row in sequence.

When, data is read in the k-th row, the potentials of the signal lines $S_{\_1}$ to $S_{\_m}$ are set to GND so that all the transistors 162 are turned off, and the selection line $G_{\_1}$ and the selection line $G_{\_2}$ are supplied with the potential $V_1$ so that the selection transistors 180 and the selection transistors 182 are turned on. The potential of the word line $WL_{\_k}$ connected to the memory cells 190 from which data is to be read in the k-th row is set to GND, and the potential $V_5$ is supplied to the word lines $WL_{\_1}$ to $WL_{\_(k-1)}$ and the word lines $WL_{\_(k+1)}$ to $WL_{\_m}$ connected to the memory cells 190 from which data is not to be read.

Note that even in the case where a structure is employed in which the selection line $G_{\_1}$ and the selection transistors 180 are omitted or the selection line $G_{\_2}$ and the selection transistors 182 are omitted and only the selection line G corresponding to the selection line $G_{\_2}$ and the selection transistors 182 are provided as illustrated in FIG. 3, data writing, data holding, data reading, and data erasing in a plurality of rows at once can be performed basically in the same manner as the above operations.

Figure 5:
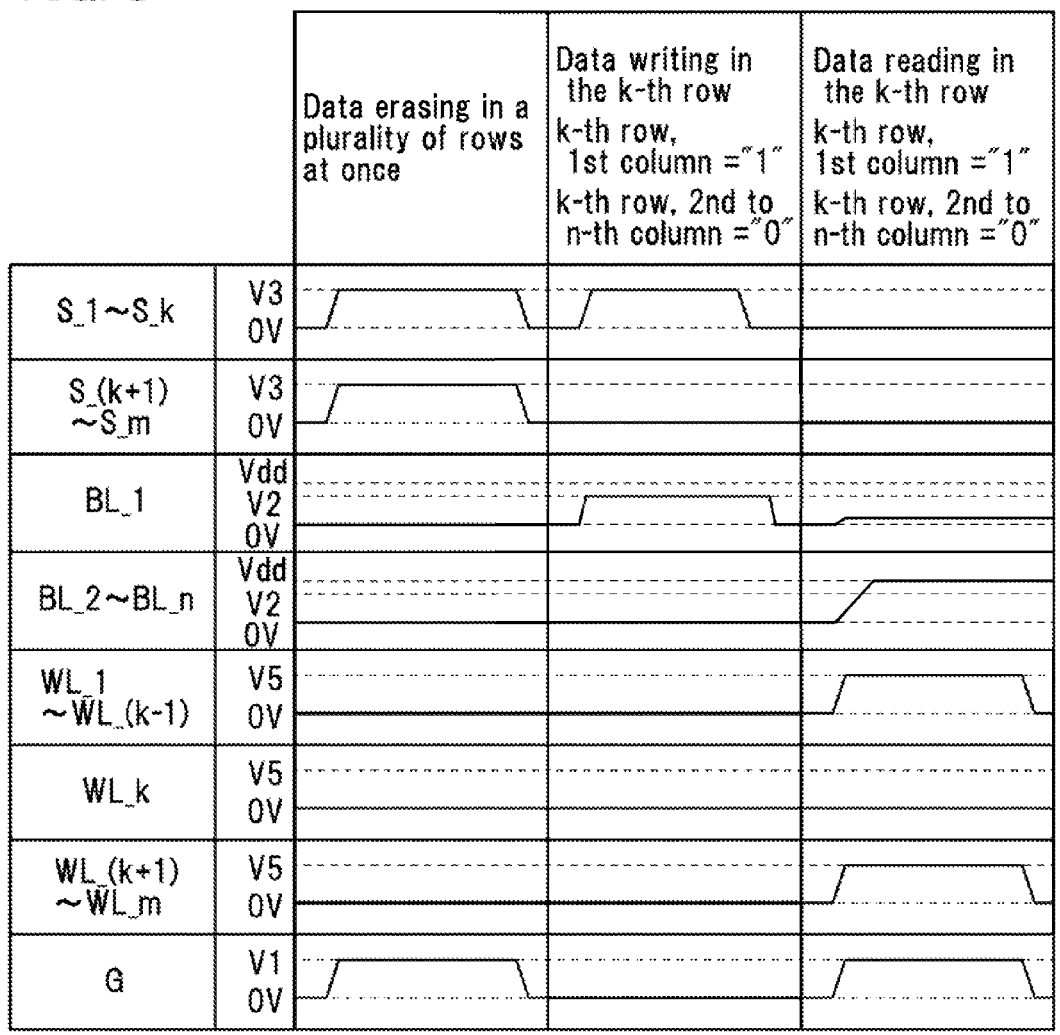
FIG. 5 is a timing chart.

Note that as for the selection line G, the operation is slightly different from that in the semiconductor device in FIG. 2. Here, the potential of the selection line G in each operation is described with reference to FIG. 5 which is a timing chart of the detailed operations of the semiconductor device in FIG. 3. In the same manner as the timing chart of FIG. 4, the timing chart of FIG. 5 shows the relation among the potentials of the lines in the case where data written to the memory cells in the first to m-th rows is erased (data erasing in a plurality of rows at once), in the case where data "1" is written to the memory cell in the k-th row and the first column and data "0" is written to the memory cells in the k-th row and the other columns (the second to n-th columns) (data writing in the k-th row), and in the case where data written to the memory cells in the k-th row is read out (data reading in the k-th row). Thus, a difference between the timing chart in FIG. 5 and the timing chart in FIG. 4 is only the potential of the selection line G, and is described below.

When data is erased in a plurality of rows at once, the selection line G is supplied with the potential $V_1$ so that the selection transistors 182 are turned on. When data writing in the k-th row is performed, the potential of the selection line G is set to GND so that the selection transistors 182 are turned off. When data is read in the k-th row, the selection line G is supplied with the potential $V_1$ so that the selection transistors 182 are turned on. In the operations of the semiconductor device in FIG. 3, the selection line G is supplied with a potential in such a manner, whereby operations similar to the above operations of the timing chart in FIG. 4 can be performed.

Since the off-state current of the transistor including an oxide semiconductor is extremely small in the semiconductor device described in this embodiment, stored data can be held for an extremely long time owing to such a transistor. In other words, refresh operation becomes unnecessary or the frequency of the refresh operation, can be extremely low, which leads to a sufficient reduction in power consumption. Moreover, stored data can be held for a long time even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate, and thus a problem such as deterioration of a gate insulating layer does not occur at all. That is, the semiconductor device according to the disclosed invention does not have a limit on the number of times of rewriting, which has been a problem of a conventional non-volatile memory, and thus has drastically improved reliability. Furthermore, since data is written by turning on or off the transistor, high-speed operation can be easily realized.

Since a transistor including a material other than an oxide semiconductor can operate at sufficiently high speed, when it is combined with a transistor including an oxide semiconductor, a semiconductor device can perform operation (e.g., reading data) at sufficiently high speed. Further, a transistor including a material other than an oxide semiconductor can suitably realize a variety of circuits (e.g., a logic circuit or a driver circuit) which need to operate at high speed.

Thus, a semiconductor device having a novel feature can be realized by being provided with both the transistor including a material other than an oxide semiconductor (a transistor capable of operation at sufficiently high speed, in general) and the transistor including an oxide semiconductor (a transistor whose off-state current is sufficiently small, in general).

In the semiconductor device described in this embodiment, the transistors each including an oxide semiconductor in the memory cells of the semiconductor device are connected in series; thus, the source electrode of the transistor including an oxide semiconductor in the memory cell and the drain electrode of the transistor including an oxide semiconductor in the adjacent memory cell can be connected to each other. That is, in each of the memory cells, one of the source electrode and the drain electrode of the transistor including an oxide semiconductor does not need to be connected to the wiring through an opening. Therefore, the area occupied by the memory cells can be reduced, whereby the degree of integration of the semiconductor device can be increased and the storage capacity per unit area can be increased.

The structures, methods, and the like described in this embodiment can be combined as appropriate with any of the structures, methods, and the like described in the other embodiments.

[Embodiment 2]

In this embodiment, a structure and a manufacturing method of a semiconductor device according to one embodiment of the disclosed invention will be described with reference to FIGS. 6A and 6B, FIGS. 7A and 7B, FIGS. 8A to 8C, FIGS. 9A to 9D, FIGS. 10 to 10D, FIGS. 11A to 11D, and FIGS. 12A to 12D.

<Cross-sectional Structure and Planar Structure of Semiconductor Device>

FIGS. 6A and 6B illustrate an example of a structure of the memory cell 190 and the selection transistor 180 in the semiconductor device illustrated in the circuit diagram of FIG. 2. FIG. 6A illustrates a cross section of the semiconductor device, and FIG. 6B illustrates a plan view of the semiconductor device. Here, FIG. 6A illustrates a cross section taken along line A1-A2 in FIG. 6B. In FIG. 6B, a direction parallel to line A1-A2 corresponds to the column direction in the circuit diagram of FIG. 2, and a direction perpendicular to line A1-A2 corresponds to the row direction in the circuit diagram of FIG. 2. The semiconductor device illustrated in FIGS. 6A and 6B includes the transistor 160 including a first semiconductor material and the selection transistor 180 in a lower portion, and the transistor 162 including a second semiconductor material in an upper portion. Note that although the transistor 160 and the transistor 162 in the first row are illustrated in FIGS. 6A and 6B, as for the transistors 160 and the transistors 162 in the first to m-th rows, the source electrode (source region) in the memory cell and the drain, electrode (drain region) in the adjacent memory cell are connected in series as illustrated in the circuit diagram of FIG. 2.

Here, the first semiconductor material and the second semiconductor material are preferably different from each other. For example, the first semiconductor material may be a semiconductor material other than an oxide semiconductor (e.g., silicon) and the second semiconductor material may be an oxide semiconductor. A transistor including a material other than an oxide semiconductor such as single crystal silicon can easily operate at high speed. On the other hand, a transistor including an oxide semiconductor can hold charge for a long time because of its characteristics.

Although both of the transistors are n-channel transistors in this description, it should be appreciated that p-channel transistors can be used. Since the technical feature of the disclosed invention is to use a semiconductor material like an oxide semiconductor, which can sufficiently reduce off-state current, for the transistor 162 in order to hold data, it is not necessary to limit specific conditions such as a structure, a material, and the like of the semiconductor device to those given here.

The transistor 160 in FIGS. 6A and 68 includes a channel formation region 116a provided in a substrate 100 including a semiconductor material (e.g., silicon); an impurity region 120a and an impurity region 120b provided so that the channel formation region 116a is sandwiched therebetween; a metal compound region 124a and a metal compound region 124b in contact with the impurity region 120a and the impurity region 120b, respectively; a gate insulating layer 108a provided over the channel formation region 116a; and a gate electrode 110a provided over the gate insulating layer 108a. Note that a transistor whose source electrode and drain electrode are not illustrated in a drawing may be referred to as a transistor for the sake of convenience. Further, in such a case, in description of connection of a transistor, a source region, and a source electrode may be collectively referred to as a source electrode and a drain region and a drain electrode may be collectively referred to as a drain electrode. That is, in this specification, the term "source electrode" may include a source region and the term "drain electrode" may include a drain region.

Note that in this specification, the impurity region 120a, the impurity region 120b, and an impurity region 120c which is described later are collectively referred to as impurity regions 120 in some eases. Further, in this specification, the metal compound region 124a, the metal compound region 124b, and a metal compound region 124c which, is described later are collectively referred to as metal compound regions 124 in some cases.

Here, the transistors 160 in the first to m-th rows share the impurity regions 120 and the metal compound regions 124 functioning as source regions and drain regions, and are connected in series. That is, the impurity region 120 and the metal compound region 124 functioning as a source region of the transistor 160 in the (l-1)-th row (l is a natural number greater than or equal to 2 and less than or equal to m) function as a drain region of the transistor 160 in the l-th row. In this manner, the transistors 160 in the memory cells 190 are connected in series, whereby the source regions and the drain regions can be shared by the transistors 160 in the memory cells 190. That is, in each of the memory cells 190, one of the source region and the drain region of the transistor 160 does not need to be connected to a wiring 158 through an opening. Therefore, the opening for connection with the wiring 158 does not need to be provided in the planar layout of the transistor 160, and the planar layout of the transistor 160 can easily overlap with the planar layout of the transistor 162 which is described later; thus, the area occupied by the memory cells 190 can be reduced.

The transistor 160 in the first row is electrically connected to the bit line through the selection transistor 180; thus, the impurity region 120b and the metal compound region 124b functioning as a drain region of the transistor 160 in the first row function as a source region of the selection transistor 180. Here, the selection transistor 180 can have the same structure as the above transistor 160. That is, the selection transistor 180 includes a channel formation region 116b provided in the substrate 100 including a semiconductor material (e.g., silicon); the impurity region 120b and the impurity region 120c provided so that the channel formation region 116b is sandwiched therebetween; the metal compound region 124b and the metal compound region 124c in contact with the impurity region 120b and the impurity region 120c, respectively; a gate insulating layer 108b provided over the channel formation region 116b; and a gate electrode 110b provided over the gate insulating layer 108b. Note that the gate electrode 110b of the selection transistor 180 functions as the selection line G in the circuit diagram of FIG. 2.

Note that in this specification, the channel formation region 116a and the channel formation region 116b are referred to as channel formation regions 116 in some cases. Further, in this specification, the gate insulating layer 108a and the gate insulating layer 108b are collectively referred to as gate insulating layers 108 in some cases. Furthermore, in this specification, the gate electrode 110a and the gate electrode 110b are collectively referred to as sate electrodes 110 in some cases.

The substrate 100 is provided with an element isolation insulating layer 106 which surrounds the transistor 160 and the selection, transistor 180. An insulating layer 128 is provided over the transistor 160 and the selection transistor 180 so as to expose top surfaces of the gate electrodes 110. Note that for high integration, it is preferable that, as in FIGS. 6A and 6B, the transistor 160 does not have a sidewall insulating layer. On the other hand, when the characteristics of the transistor 160 have priority, the sidewall insulating layer may be formed on a side surface of the gate electrode 110 and the impurity regions 120 may include a region having a different impurity concentration.

Here, the insulating layer 128 preferably has a surface with favorable planarity; for example, the surface of the insulating layer 128 preferably has a root-mean-square (RMS) roughness of 1 nm or less.

The transistor 162 in FIGS. 6A and 6B includes a source electrode 142a and a drain electrode 142b which are embedded in an insulating layer 140 formed over the insulating layer 128; an oxide semiconductor layer 144 in contact with part of the insulating layer 140, the source electrode 142a, and the drain electrode 142b; a gate insulating layer 146 covering the oxide semiconductor layer 144; and a gate electrode 148 provided over the gate insulating layer 146 so as to overlap with the oxide semiconductor layer 144, Note that the gate electrode 148 functions as the signal line S in the circuit diagram of FIG. 2.

Here, it is preferable that the oxide semiconductor layer 144 be highly purified by sufficient removal of impurities such as hydrogen or sufficient supply of oxygen. Specifically the hydrogen concentration in the oxide semiconductor layer 144 is lower than or equal to $5 \times 10^{19}$ atoms/cm$^3$, preferably lower than or equal to $5 \times 10^{18}$ atoms/cm$^3$, more preferably lower than or equal to $5 \times 10^{17}$ atoms/cm$^3$, for example. Note that, the hydrogen concentration in the oxide semiconductor layer 144 is measured by secondary ion mass spectrometry (SIMS). Thus, in the oxide semiconductor layer 144 in winch the hydrogen concentration is sufficiently reduced so that the oxide semiconductor layer is highly purified and in which defect levels in the energy gap due to oxygen, deficiency are reduced by sufficient supply of oxygen, the density of carriers due to a donor such as hydrogen is lower than $1 \times 10^{12}$/cm$^3$, preferably lower than $1 \times 10^{11}$/cm$^3$, more preferably lower than $1.45 \times 10^{10}$/cm$^3$. For example, the off-state current (here, current per micrometer (μm) of channel width) at room temperature (25° C.) is 100 zA (1 zA (zeptoampere) is $1 \times 10^{-21}$ A) or less, preferably 10 zA or less. With the use of such, an i-type (intrinsic) or substantially i-type oxide semiconductor, the transistor 162 which has significantly excellent off-state current characteristics can be obtained.

Note that a region which is part of a surface of the insulating layer 140 and in contact with the oxide semiconductor layer 144 preferably has a root-mean-square (RMS) roughness of 1 nm or less. In this manner, a channel formation region of the transistor 162 is provided in the extremely flat region having a root-mean-square (RMS) roughness of 1 nm or less, whereby the transistor 162 which can prevent a malfunction such as a short-channel effect and has favorable characteristics can be provided even when the transistor 162 is miniaturized.

The transistors 162 in the first to m-th rows share the source electrodes 142a and the drain electrodes 142b, and are connected in series. That is, the source electrode 142a of the transistor 162 in the (l−1)-th row (l is a natural number greater than or equal to 2 and less than or equal to m) and the drain electrode 342b of the transistor 162 in the l-th row are formed from the same conductive layer.

In this manner, the transistors 162 in the memory cells 190 are connected in series, whereby the source electrode 142a of the transistor 162 in the memory cell 190 and the drain electrode 142b of the transistor 162 in the adjacent memory cell 190 can be connected to each other. Thus, only one of the source electrode 142a and the drain electrode 142b of the transistor 162 is included in the planar layout of the memory cell 190. That is, the length in a column direction in the planar layout of the memory cell 190 can be as small as about the sum of the minimum width of the gate electrode 148 and the minimum distance between the gate electrodes 148.

On the other hand, in the case where the transistors 162 in the memory cells 190 are connected in parallel and the source electrode 142a and the drain electrode 142b are provided for each of the transistors 162 in the memory cells 190, one of the source electrode 142a and the drain, electrode 142b of the transistor 162 in the memory cell 190 needs to be connected to a wiring such as the wiring 158 through an opening. Thus, both of the source electrode 142a and the drain, electrode 142b of the transistor 162 and the opening for connection with the wiring are included in the planar layout of the memory cell 190.

Therefore, the structure illustrated in FIGS. 6A and 6B is employed for the planar layout of the memory cell 190, whereby the area occupied by the memory cells 190 can be reduced. For example, when F is used to express the minimum feature size, the area occupied by the memory cell 190 can be expressed as 4 F$^2$ to 12 F$^2$, Accordingly, the degree of integration of the semiconductor device can be increased, and the storage capacity per unit area can be increased.

The capacitor 164 in FIGS. 6A and 6B includes the source electrode 142a; the oxide semiconductor layer 144; the gate insulating layer 146; and an insulating layer 150 and an electrode 152 over the gate insulating layer 146, That is, the source electrode 142a functions as one electrode of the capacitor 164, and the electrode 152 functions as the other electrode of the capacitor 164. Note that the gate insulating layer 146 is not necessarily provided in the capacitor 164, With such a structure, a dielectric layer in the capacitor 164 is formed of the oxide semiconductor layer 144 and the insulating layer 150, whereby the thickness of the dielectric layer can be reduced and the capacitance of the capacitor 164 can be increased.

Here, one electrode of the capacitor 164 in the (l−1)-th row (l is a natural number greater than or equal to 2 and less than, or equal to m) is the source electrode 142a of the transistor 162 in the (l−1)-th row; therefore, the planar layout of the capacitor 164 can easily overlap with the planar layout of the transistor 162, and the area occupied by the memory cells 190 can be reduced. The electrode 152 is formed over the insulating layer 150, whereby the gate electrodes 148 in the adjacent memory cells 190 can be formed with the minimum distance and the electrode 152 can be formed between the gate electrodes 148 in the adjacent memory cells 190. Therefore, the area occupied by the memory cells 190 can be reduced. Note that the electrode 152 functions as the word line WL in the circuit diagram of FIG. 2.

The insulating layer 150 is provided over the transistor 162, and an insulating layer 154 is provided over the insulating layer 150 and the electrode 152 of the capacitor 164. In an opening formed in the gate insulating layer 146, the insulating layer 150, the insulating layer 154, and the like, an electrode 156a is provided. Over the insulating layer 154, the wiring 158 connected to the electrode 156a is formed. The wiring 158 and the metal compound region 124c functioning as a drain region of the selection transistor 180 are electrically connected to each other through an electrode 156b provided in the opening formed in the gate insulating layer 146, the insulating layer 150, the insulating layer 154, and the like, through an electrode 142c embedded in the insulating-layer 140, and through an electrode 126 embedded in the insulating layer 128. Here, the wiring 158 functions as the bit line BL in the circuit diagram of FIG. 2.

With the above structure, the size of the planar layout of the memory cell 190 including the transistor 160, the transistor 162, and the capacitor 164 can be reduced. In the planar layout of the memory cell 190, the length in a row direction can be reduced as small as about the sum of the minimum width of the wiring 158 functioning as the bit line BL and the minimum distance between the wirings 158. In addition, in the planar layout of the memory cell 190, the length in a column, direction can be reduced as small as about the sum of the minimum width of the gate electrode 148 and the minimum distance between the gate electrodes 148. When such a planar layout is employed, the degree of integration of the circuit in FIG. 2 can be increased. For example, when F is used to express the minimum feature size, the area occupied by the memory cell can be expressed as $4 F^2$ to $12 F^2$. Accordingly, the storage capacity per unit area of the semiconductor device can be increased.

Note that the structure of a semiconductor device according to the disclosed invention is not limited to that illustrated in FIGS. 6A and 6B. Since the spirit of techniques of one embodiment of the disclosed invention is to form a stacked structure including an oxide semiconductor and a material other than an oxide semiconductor, the details of connection relation of electrodes or the like can be changed as appropriate.

Figure 7A:
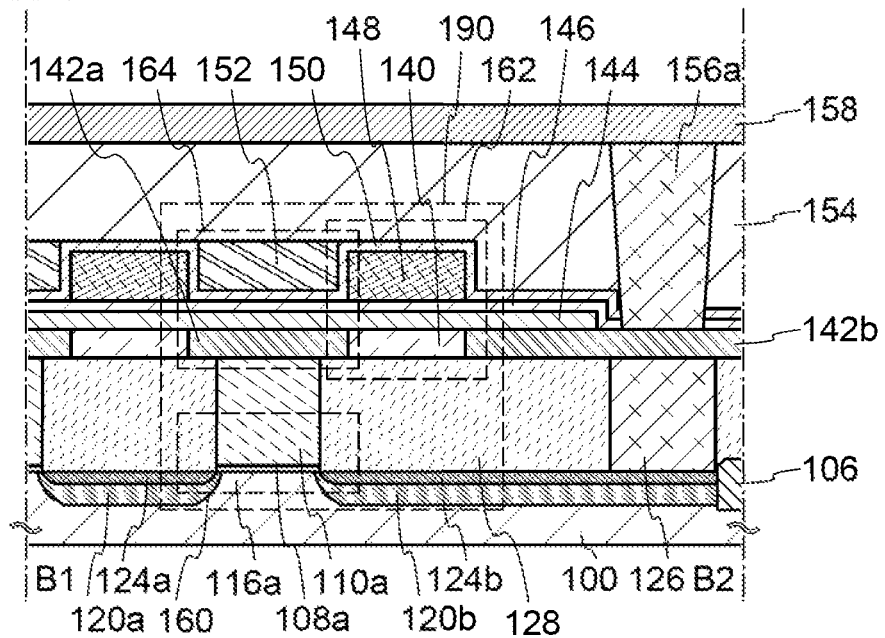
FIGS. 7A and 7B are a cross-sectional, view and a plan view of a semiconductor device.
Figure 7B:
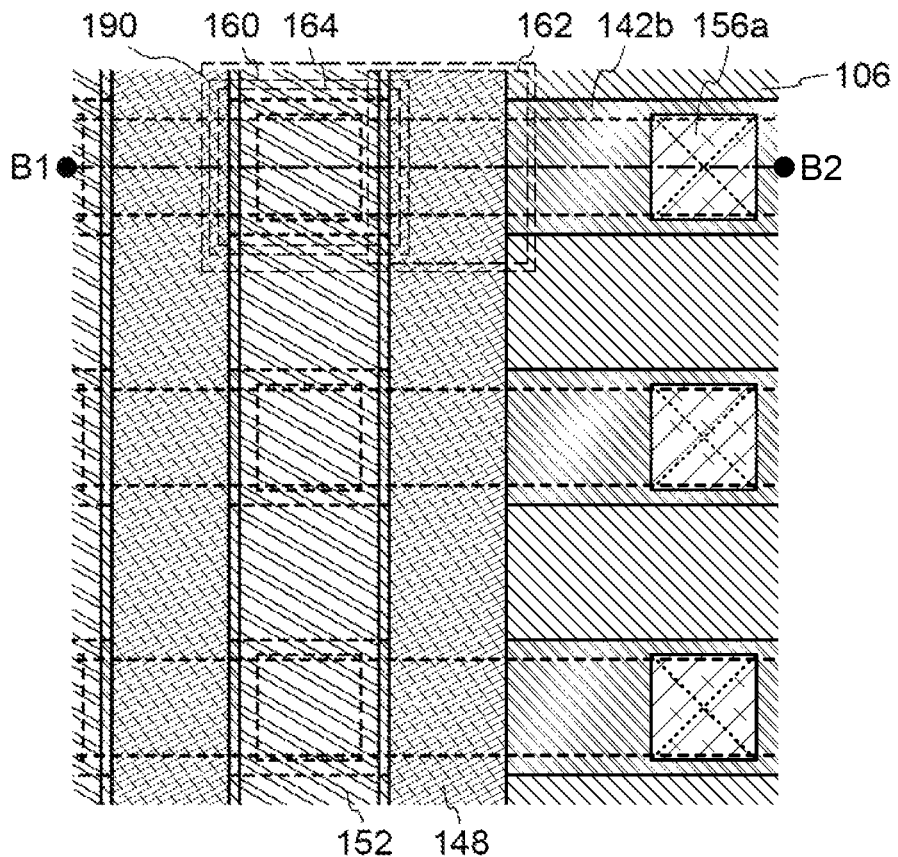

For example, as illustrated in FIG. 3, in the ease where a structure is employed in which the selection line $G_{\_1}$ and the selection transistors 180 are omitted or the selection line $G_{\_2}$ and the selection transistors 182 are omitted and only the selection line G corresponding to the selection line $G_{\_2}$ and the selection transistors 182 are provided, one example of a structure of a connection portion between the memory cell 190 in the first row and the bit line BL is illustrated in FIGS. 7A and 7B. FIG. 7A illustrates a cross section of the semiconductor device, and FIG. 7B illustrates a plan view of the semiconductor device. Here, FIG. 7A corresponds to a cross section taken along line B1-B2 in FIG. 7B.

One of differences between the semiconductor device illustrated in FIGS. 7A and 7B and the semiconductor device illustrated in FIGS. 6A and 6B is whether the selection transistors 180 are provided or not. Thus, the details of the semiconductor device illustrated in FIGS. 6A and 6B can be referred to for the details of the semiconductor device illustrated in FIGS. 7A and 7B. In the semiconductor device illustrated in FIGS. 7A and 7B, the same reference numerals are used to denote the same portions as those in FIGS. 6A and 6B.

Note that unlike in the semiconductor device illustrated in FIGS. 6A and 6B, the wiring 158 and the metal compound region 124b functioning as a drain region of the transistor 160 are electrically connected to each other through the electrode 156a provided in the opening formed in the gate insulating layer 146, the insulating layer 150, and the insulating layer 154, through the drain electrode 142b embedded in the insulating layer 140, and through the electrode 126 embedded in the insulating layer 128.

Note that the semiconductor device illustrated in FIGS. 6A and 6B has a structure in which the insulating layer 140, the source electrode 142a embedded in the insulating layer 140, and the oxide semiconductor layer 144 over the drain electrode 142b are provided; however, as illustrated in FIG. 8A, a structure may be employed in which the insulating layer 140, the source electrode 142a embedded in the insulating layer 140, and the drain electrode 142b are not provided and the oxide semiconductor layer 144 is provided on and in direct contact with the gate electrode 110a and the insulating layer 128. Here, FIG. 8A illustrates a cross-sectional view of a semiconductor device. A main difference between the semiconductor device illustrated in FIG. 8A and the semiconductor device illustrated in FIGS. 6A and 6B is whether the insulating layer 140, the source electrode 142a, and the drain electrode 142b are provided or not. In the semiconductor device illustrated in FIG 8A, the same reference numerals are used to denote die same portions as those in FIGS. 6A and 6B.

Here, in the semiconductor device illustrated in FIG. 8A, a structure can be employed in which the gate electrode 110a functions as a source electrode or a drain electrode of the transistor 162, That is, the gate electrode 110a of the transistor 160 in the (l−1)-th row (l is a natural number greater than or equal to 2 and less than or equal to m), the source electrode of the transistor 162 in the (l−1)-th row, and the drain electrode of the transistor 162 in the l-th row are formed from the same conductive layer. In the semiconductor device illustrated in FIGS. 6A and 6B, the length of the gate electrode 110a in a column direction is smaller than the length of the source electrode 142a in a column direction in consideration of a contact; therefore, in the semiconductor device illustrated in FIG. 8A in which, the source electrode 142a is not provided, the area occupied by the memory cells 190 can be reduced.

In the semiconductor device illustrated in FIG. 8A, an electrode 159a is preferably provided between the electrode 156a and the oxide semiconductor layer 144 so that the wiring 158 and the oxide semiconductor layer 144 can be electrically connected to each other. With such a structure, a contact between the wiring 158 and the oxide semiconductor layer 144 can be obtained easily and reliably. Similarly, a structure may be employed in which an electrode 159b is provided between the electrode 156b and the electrode 126 so that the wiring 158 and the metal compound region 124c of the selection transistor 180 are electrically connected to each other.

Note that the electrode 159a and the electrode 159b can be formed at the same time as the formation of the electrode 152.

Alternatively, as illustrated in FIG. 8B, a structure may be employed in which the transistor 160 and the selection, transistor 180 are formed over an SOI substrate. Here, FIG. 8B illustrates a cross-sectional view of a semiconductor device. One of differences between the semiconductor device illustrated in FIG. 8B and the semiconductor device illustrated in FIGS. 6A and 6B is that the channel formation regions 116 and the impurity regions 120 in the transistor 160 and the selection transistor 180 are formed from a semiconductor layer provided in the SOI substrate. In the semiconductor device illustrated in FIG. 8B, the same reference numerals are used to denote the same portions as those in FIGS. 6A and 6B. Note that the term "SOI substrate" generally means a substrate where a silicon semiconductor layer is provided on an insulating surface. In this specification and the like, the term "SOI substrate" also means a substrate where a semiconductor layer including a material other than silicon is provided on an insulating surface. That is, the semiconductor layer included in the "SOI substrate" is not limited to a silicon, semiconductor layer. Moreover, the SOI substrate can be a substrate having a structure in which a semiconductor layer is provided over an insulating substrate such as a glass substrate with an insulating layer positioned therebetween.

The SOI substrate illustrated in FIG. 8B includes a base substrate 170, a nitrogen-containing layer 172 formed over the base substrate 170, an oxide film 174 formed over the nitrogen-containing layer 172, and the semiconductor layer formed over the oxide film 174. The channel formation regions 116 and the impurity regions 120 of the transistor 160 and the selection transistor 180 are formed from the semiconductor layer.

Here, as the base substrate 170, a substrate formed of an insulator can be used. As specific examples thereof, the following are given: a variety of glass substrates used in the electronics industry, such as substrates made of alumnosilicate glass, aluminoborosilicate glass, and barium bore-silicate glass; a quartz substrate; a ceramic substrate; and a sapphire substrate. Alternatively, a ceramic substrate which contains silicon nitride and aluminum nitride as main components and whose coefficient of thermal expansion is close to that of silicon may be used.

As the nitrogen-containing layer 172, a layer including an insulating film containing nitrogen, such as a silicon nitride ($SiN_x$) film, or a silicon nitride oxide ($SiN_xO_y$ (x>y)) film can be used. The oxide film 174 can be formed with a single layer or a stacked layer of a silicon oxide film, a silicon oxynitride film, or the like.

As the semiconductor layer for forming the channel formation regions 116 and the impurity regions 120, a semiconductor layer which is formed using a single crystal semiconductor substrate that is formed of an element belonging to Group 14, such as a single crystal silicon substrate, a single crystal germanium substrate, or a single crystal silicon germanium substrate, and which has a thickness of greater than or equal to 10 nm and less than or equal to 500 nm, preferably greater than or equal to 50 nm and less than or equal to 200 nm may be used.

Note that the semiconductor device illustrated in FIGS. 6A and 6B has a structure in which the source electrode 142a and the drain electrode 142b are embedded in the insulating layer 140; however, as illustrated in FIG. 8B, a structure may be employed in which the source electrode 142a and the drain electrode 142b are not embedded in the insulating layer and are provided over the gate electrode 110 and the insulating layer 128. Here, end portions of the source electrode 142a and the drain electrode 142b preferably have tapered shapes. When the end portions of the source electrode 142a and the drain electrode 142b are tapered, the coverage with the oxide semiconductor layer 144 can be improved and a breaking thereof can be prevented. Here, the taper angle is greater than or equal to 30° and less than or equal to 60°, for example. Note that the "taper angle" means an angle formed by the side surface and the bottom surface of a layer having a tapered shape (for example, the source electrode 142a) when observed from a direction perpendicular to a cross section thereof (a plane perpendicular to the substrate surface).

Alternatively, as illustrated in FIG. 8C, a structure may be employed in which, as the other electrode of the capacitor 164, an electrode 153 is formed from the same conductive layer as the gate electrode 148. Here, FIG. 8C illustrates a cross-sectional view of a semiconductor device. One of differences between the semiconductor device illustrated in FIG. 8C and the semiconductor device illustrated in FIG. 8B is that the other electrode of the capacitor 164 is formed using the electrode 153 which is formed from the same conductive layer as the gate electrode 148. In the semiconductor device illustrated in FIG. 8C, the same reference numerals are used to denote the same portions as those in FIG 8B.

The electrode 153 can be formed at the same time as the formation of the gate electrode 148; thus, the manufacturing process of the semiconductor device can be simplified and the manufacturing cost of the semiconductor device can be reduced as compared with those in the case where the electrode 152 and the gate electrode 148 are formed from different conductive films as illustrated in FIGS. 6A and 6B and FIGS. 8A. and 8B.

Even when such a structure is employed, the source electrode of the transistor including an oxide semiconductor in the memory cell and the drain electrode of the transistor including an oxide semiconductor layer in the adjacent memory cell can be connected to each other. That is, one of the source electrode and the drain electrode of the transistor including an oxide semiconductor does not need to be connected to a wiring through an opening. Therefore, the area occupied by the memory cells can be reduced, whereby the degree of integration of the semiconductor device can be increased and the storage capacity per unit area can be increased.

Note that the semiconductor device illustrated in FIG. 8B has a structure in which the oxide semiconductor layer 144 is in contact with part of side surfaces and top surfaces of the source electrode 142a and the drain electrode 142b; however, the disclosed invention is not limited to this. For example, as illustrated in FIG. 8C, a structure may be employed in which the source electrode 142a and the drain electrode 142b are in contact with part of a side surface and a top surface of the oxide semiconductor layer 144.

<Method for Manufacturing Semiconductor Device>

Next, an example of a method for manufacturing the semiconductor device will be described. First, a method for manufacturing the transistor 160 and the selection transistor 180 in the lower portion will be described below with reference to FIGS. 9A to 9D and FIGS. 10A to 10D, and then a method for manufacturing the transistor 162 and the capacitor 164 in the upper portion will be described with reference to FIGS. 11A to 11D and FIGS. 12A to 12D.

<Method for Manufacturing Transistor in Lower Portion>

Figure 9A:
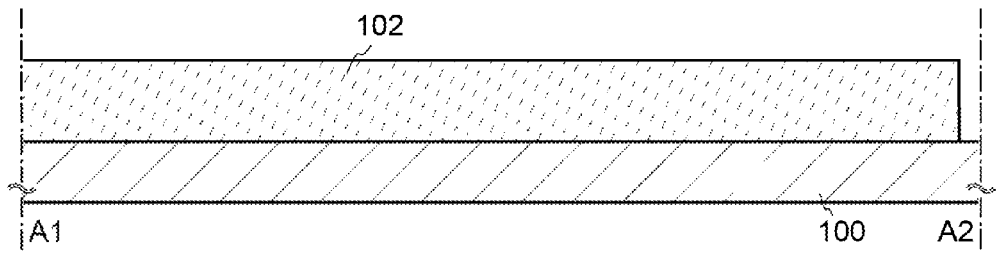
FIGS. 9A to 9D are cross-sectional views illustrating manufacturing steps of a semiconductor device.
Figure 9B:
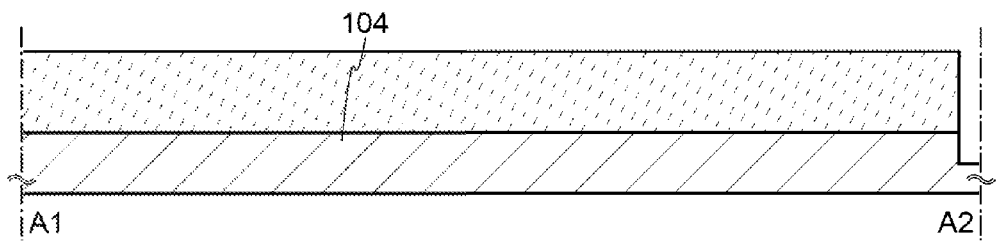

First, the substrate 100 including a semiconductor material is prepared (see FIG. 9A). As the substrate 100 including a semiconductor material, a single crystal semiconductor substrate or a polycrystalline semiconductor substrate made of silicon, silicon carbide, or the like; a compound semiconductor substrate made of silicon germanium or the like; an SOI substrate; or the like can be used. Here, an example where a single crystal silicon substrate is used as the substrate 100 including a semiconductor material is described.

As the substrate 100 including a semiconductor material, a single crystal semiconductor substrate of silicon or the like is particularly preferable because high-speed reading operation of the semiconductor device can be realized.

In order to control the threshold voltage of the transistor, an impurity element may be added to regions which later function as the channel formation region 116*a* of the transistor 160 and the channel formation region 116*b* of the selection transistor 180. Here, an imparity element imparting conductivity is added so that the threshold voltage of the transistor 160 and the threshold voltage of the selection transistor 180 become positive. When the semiconductor material is silicon, the impurity imparting conductivity may be boron, aluminum, gallium, or the like. Note that it is preferable to perform heat treatment after adding an impurity element, in order to activate the impurity element or reduce defects which may be generated during addition of the impurity element.

A protective layer 102 serving as a mask for forming, an element isolation insulating layer is formed over the substrate 100 (see FIG. 9A). As the protective layer 102, an insulating layer formed using a material such as silicon oxide, silicon nitride, or silicon, oxynitride can be used, for example.

Then, part of the substrate 100 in a region that is not covered with the protective layer 102 (in an exposed region) is removed by etching using the protective layer 102 as a mask. Thus, a semiconductor region 104 isolated from, the other semiconductor regions is formed (see FIG. 9B). As the etching, dry etching is preferably performed, but wet etching may be performed. An etching gas and an etchant can be selected as appropriate in accordance with a material to be etched.

Figure 9C:
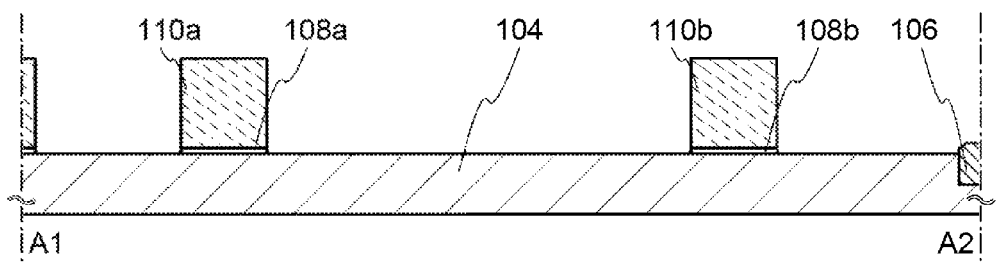

Then, an insulating layer is formed so as to cover the substrate 100, and the insulating layer in a region, overlapping with the semiconductor region 104 is selectively removed, whereby the element isolation insulating layer 106 is formed, (see FIG. 9C). The insulating layer is formed using silicon oxide, silicon nitride, silicon oxynitride or the like. For removing the insulating layer, any of etching treatment and polishing treatment such as chemical mechanical polishing (CMP) treatment can be employed. Note that the protective layer 102 is removed after the formation, of the semiconductor region 104 or after the formation of the element isolation insulating layer 106.

Next, an insulating layer is formed on a surface of the semiconductor region 104, and a layer including a conductive material is formed over the insulating layer.

The insulating layer is to he a gate insulating layer later, and can be formed by heat treatment (thermal oxidation treatment, thermal nitridation treatment, or the like) on the surface of the semiconductor region 104, for example. High-density plasma treatment may be employed instead of heat treatment. The high-density plasma treatment can be performed using, for example, a mixed gas of a rare gas such as He, Ar, Kr, or Xe, oxygen, nitrogen oxide, ammonia, nitrogen, hydrogen, and the like. Needless to say, the insulating layer may be formed by a CVD method, a sputtering method, or the like. The insulating layer preferably has a single-layer structure or a stacked structure including silicon oxide, silicon oxynitride, silicon nitride, hafnium oxide, aluminum oxide, tantalum oxide, yttrium oxide, hafnium silicate ($HfSi_xO_y$ ($x>0$, $y>0$)), hafnium silicate ($HfSi_xO_y$ ($x>0$, $y>0$)) to which, nitrogen is added, hafnium aluminate ($HfAl_xO_y$ ($x>0$, $y>0$)) to which nitrogen is added, or the like. The insulating layer can have a thickness of for example, greater than or equal to 1 nm and less than or equal to 100 nm, preferably greater than or equal to 10 nm and less than or equal to 50 nm.

The layer including a conductive material can be formed using a metal material such as aluminum, copper, titanium, tantalum, or tungsten. Further, the layer including a conductive material may be formed using a semiconductor material such, as polycrystalline silicon. There is no particular limitation on the method for forming the layer including a conductive material, and any of a variety of film formation methods such as an evaporation method, a CVD method, a sputtering method, and a spin coating method can be employed. Note that in this embodiment, an example where the layer including a conductive material is formed using a metal material is described.

After that the insulating layer and the layer including a conductive material are selectively etched, whereby the gate insulating layers 108 (the gate insulating layer 108*a* and the gate insulating layer 108*b*) and the gate electrodes 110 (the gate electrode 110*a* and the gate electrode 110*b*) are formed (see FIG. 9C).

Figure 9D:
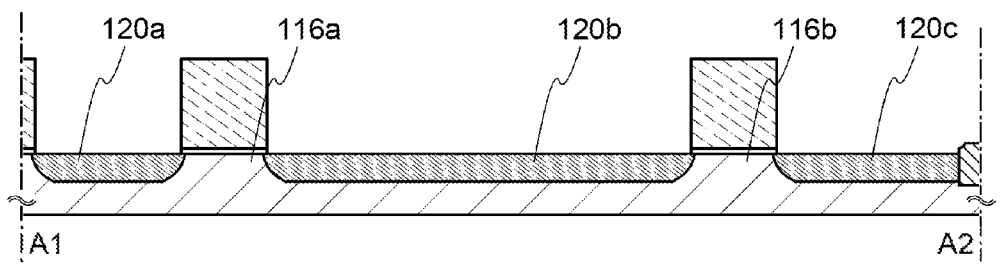

Then, phosphorus (P), arsenic (As), or the like is added to the semiconductor region 104, whereby the channel formation regions 116 (the channel formation region 116*a* and the channel formation region 116*b*) and the impurity regions 120 (the impurity region 120*a*, the impurity region 120*b*, and the impurity region 120*c*) are formed (see FIG. 9D). Note that phosphorus or arsenic is added here in order to form, an n-channel transistor; an impurity element such as boron (B) or aluminum (Al) may be added when a p-channel transistor is formed. Here, the concentration of the impurity which is added can be set as appropriate; however, the concentration is preferably increased when the semiconductor element is highly miniaturized.

Note that a sidewall insulating layer may be formed around the gate electrode 110 and an impurity region to which an impurity element is added at a different concentration may be formed.

Figure 10A:
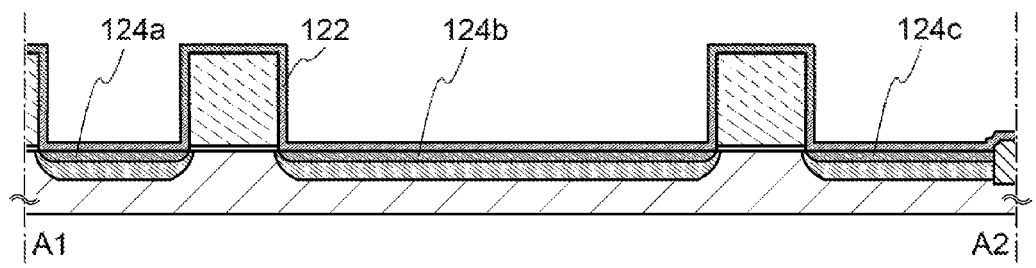
FIGS. 10A to 10D are cross-sectional views illustrating manufacturing steps of a semiconductor device.

Then, a metal layer 122 is formed so as to cover the gate electrodes 110, the impurity regions 120, and the like (see FIG. 10A). Any of a variety of film formation methods such as a vacuum evaporation method, a sputtering method, and a spin coating method can be employed for forming the metal layer 122. It is preferable that the metal layer 122 be formed using a metal material that reacts with a semiconductor material included in the semiconductor region 104 to form a low-resistance metal compound. Examples of such a metal material include titanium, tantalum, tungsten, nickel, cobalt, and platinum.

Then, heat treatment is performed so that the metal layer 122 may react with the semiconductor material. Thus, the metal compound regions 124 (the metal compound region 124*a*, the metal compound region 124*b*, and the metal compound region 124*c*) which are in contact with the impurity regions 120 (the impurity region 120*a*, the impurity region 120*b*, and the impurity region 120*c*) are formed (see FIG. 10A). Note that when, the gate electrode 110 is formed using noncrystalline silicon or the like, a metal compound region, is also formed in a region of the gate electrode 110 which is in contact with the metal layer 122.

As the heat treatment, irradiation with a flash lamp can be employed, for example. Although it should be appreciated that another heat treatment method may be used, a method by which the heat treatment can be achieved in an extremely short time is preferably used in order to improve the controllability of chemical reaction for formation of the metal compound. Note that the metal compound regions are formed by the reaction of the metal material and the semiconductor material and have sufficiently high conductivity. The formation of the metal compound regions can sufficiently reduce electric resistance and improve element characteristics. Note that the metal layer 122 is removed after the metal compound regions 124 are formed.

Figure 10B:
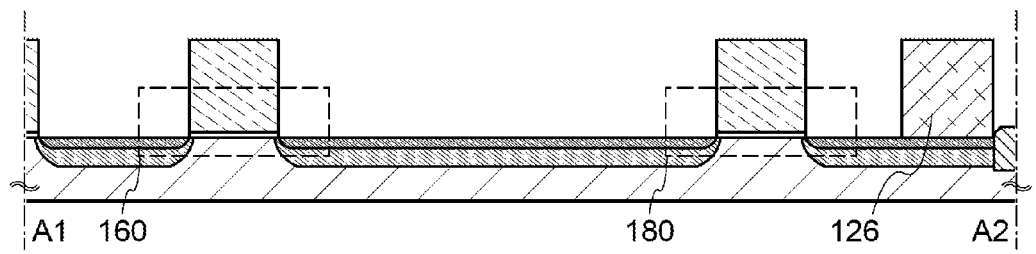

Next, the electrode 126 is formed on and in contact with the metal compound region 124c of the selection transistor 180 (see FIG. 10B). The electrode 126 is formed by a PVD method typified, by a sputtering method, or a CVD method, such as a plasma CVD method and then patterning the conductive layer. As a material for the conductive layer, an element selected from aluminum, chromium, copper, tantalum, titanium, molybdenum, and tungsten; an alloy including any of these elements as a component; or the like can be used. Any of manganese, magnesium, zirconium, beryllium, neodymium, scandium, or a material including any of these in combination may be used. The details are similar to those of the source electrode 142a, the drain electrode 142b, and the like which are described later.

Through the above steps, the transistor 160 and the selection transistor 180 are formed with the use of the substrate 100 including a semiconductor material (see FIG. 10B). The transistor 160 can operate at high speed. By using this transistor as a reading transistor, data can be read out at high speed.

Figure 10C:
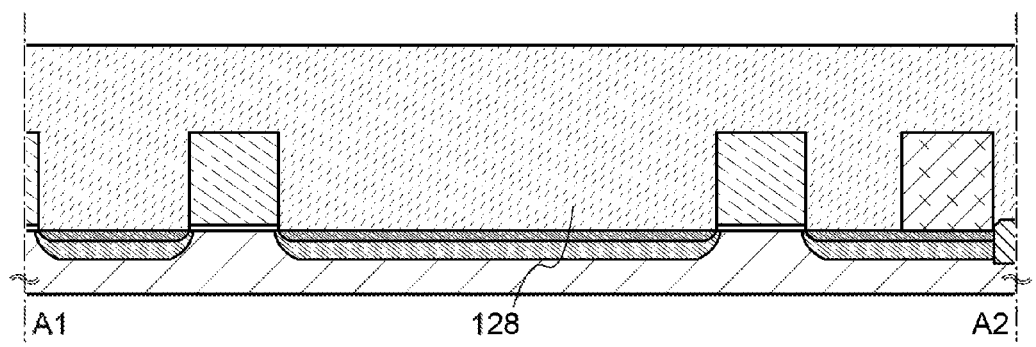

Then, the insulating layer 128 is formed so as to cover the components formed in the above steps (see FIG. 10C). The insulating layer 128 can be formed using a material including an inorganic insulating material such as silicon oxide, silicon oxynitride, silicon nitride, or aluminum oxide. In particular, a material with a low dielectric constant (a low-k material) is preferably used for the insulating layer 128, because capacitance due to overlap of electrodes or wirings can be sufficiently reduced. Note that the insulating layer 128 may be a porous insulating layer formed using any of those materials. A porous insulating layer has a lower dielectric constant than an insulating layer with high density, and thus allows a further reduction in capacitance generated, by electrodes or wirings. Further, the insulating layer 128 can be formed using an organic insulating material such as polyimide or acrylic. Note that although the insulating layer 128 has a single-layer structure here, one embodiment of the disclosed invention is not limited to this. The insulating layer 128 may have a stacked structure of two or more layers.

Figure 10D:
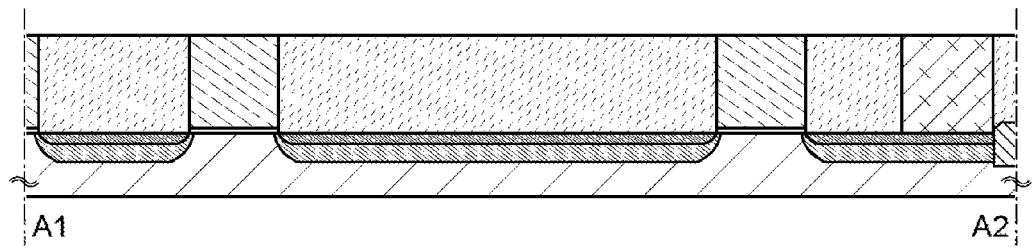

Then, as pretreatment for the formation of the transistor 162 and the capacitor 164, CMP treatment is performed on the insulating layer 128 to expose the upper surfaces of the gate electrode 110a, the gate electrode 110b, and the electrode 126 (see FIG. 10D). As the treatment for exposing the upper surfaces of the gate electrodes 110, etching treatment may be employed as an alternative to CMP treatment. Note that it is preferable to planarize the surface of the insulating layer 128 as much as possible in order to improve the characteristics of the transistor 162. For example, the surface of the insulating layer 128 preferably has a root-mean-square (RMS) roughness of 1 nm or less.

Note that a step of forming an electrode, a wiring, a semiconductor layer, an insulating layer, or the like may be further provided before and after each of the above steps. For example, the wiring may have a multi-layer structure including a stacked structure of an insulating layer and a conductive layer to provide a highly integrated semiconductor device.

<Method for Manufacturing Transistor in Upper Portion>

Figure 11A:
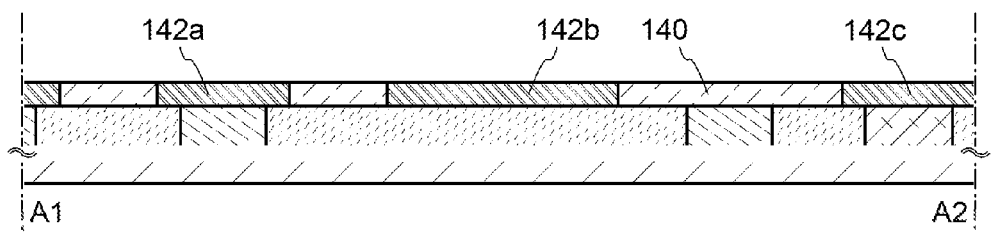
FIGS. 11A to 11D are cross-sectional views illustrating manufacturing steps of a semiconductor device.

Then, a conductive layer is formed over the gate electrode 110, the electrode 126, the insulating layer 128, and the like and is selectively etched, whereby the source electrode 142a, the drain electrode 142b, and the electrode 142c are formed (see FIG. 11A).

The conductive layer can be formed by a PVD method typified by a sputtering method or a CVD method such as a plasma CVD method. As a material for the conductive layer, an element selected from aluminum, chromium, copper, tantalum, titanium, molybdenum, or tungsten; an alloy including any of these elements as a component; or the like can be used. Any of manganese, magnesium, zirconium, beryllium, neodymium, scandium, or a material including any of these in combination may be used.

The conductive layer may have a single-layer structure or a stacked structure of two or more layers. For example, a single-layer structure of a titanium film or a titanium nitride film, a single-layer structure of an aluminum film including silicon, a two-layer structure in which a titanium film is stacked over an aluminum film, a two-layer structure in which a titanium film is stacked over a titanium nitride film, a three-layer structure in which a titanium film, an aluminum film, and a titanium film are stacked, and the like can be given. Note that in the case where the conductive layer has a single-layer structure of a titanium film or a titanium nitride film, there is an advantage that the conductive layer is easily processed into the source electrode 142a, the drain electrode 142b, and the electrode 142c having tapered shapes.

Alternatively, the conductive layer may be formed, using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_{O2}$, which may be abbreviated to ITO), an indium oxide-zinc oxide alloy ($In_2O_3$—ZnO), or any of these metal oxide materials including silicon or silicon, oxide can be used.

Although either dry etching or wet etching may be performed as die etching of the conductive layer, dry etching with high controllability is preferably used for miniaturization. The etching may be performed so that the source electrode 142a and the drain electrode 142b to be formed have tapered shapes. The taper angle can be, for example, greater than or equal to 30° and less than or equal to 60°.

The channel length (L) of tire transistor 162 in the tipper portion is determined by the distance between an upper end portion of the source electrode 142a and an upper end portion of the drain electrode 142b. Note that in light exposure for forming a mask for a transistor with a channel length (L) of less than 25 nm, it is preferable to use extreme ultraviolet rays whose wavelength is as short as several nanometers to several tens of nanometers. The resolution of light exposure with extreme ultraviolet rays is high and the depth of focus is large. Accordingly, the channel length (L) of the transistor formed later can be less than 2 μm, preferably greater than or equal to 10 nm and less than or equal to 350 nm (0.35 μm), whereby the operation speed of the circuit can be increased.

Note that an insulating layer serving as a base may be provided over the insulating layer 128. The insulating layer can be formed by a PVD method, a CVD method, or the like.

Next, the insulating layer 140 is formed so as to cover the source electrode 142a, the drain electrode 142b, and the electrode 142c. Then, in order to planatize the insulating layer 140, chemical mechanical polishing (CMP) treatment is performed, so that the source electrode 142a, the drain electrode 142b, and the electrode 142c are exposed (see FIG. 11A).

The insulating layer 140 can be formed using a material including an inorganic insulating material such as silicon oxide, silicon oxynitride, silicon nitride, or aluminum oxide. It is particularly preferable that the insulating layer 140 be formed using silicon oxide because the oxide semiconductor layer 144 formed later is in contact with the insulating layer 140. Although there is no particular limitation on the forming method of the insulating layer 140, in consideration of contact with the oxide semiconductor layer 144, a method in which hydrogen is sufficiently reduced is preferably employed. Examples of such a method include a sputtering method and the like. Needless to say, another deposition, method such as a plasma CVD method may be used.

The chemical mechanical polishing (CMP) treatment is performed so as to expose at least part of surfaces of the source electrode 142a, the drain electrode 142b, and the electrode 142c. In addition, the CMP treatment is preferably performed under such conditions that the root-mean-square (RMS) roughness of the surface of the insulating layer 140 becomes 1 nm or less (preferably 0.5 nm or less). By the CMP treatment performed under such conditions, the planarity of a surface where the oxide semiconductor layer 144 is formed later can be improved, and the characteristics of the transistor 162 can be improved.

Note that the CMP treatment may be performed only once or plural times. When the CMP treatment is performed plural times, it is preferable that first polishing be performed at a high polishing rate and final polishing be performed at a low polishing rate. By performing polishing at different polishing rates, the planarity of the surface of the insulating layer 140 can be further improved.

Figure 11B:
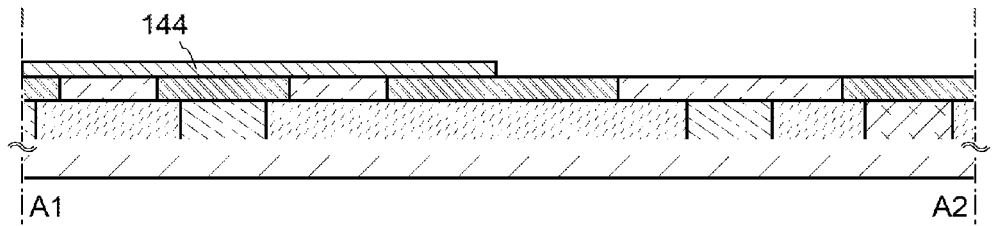

Then, after an oxide semiconductor layer is formed in contact with part of the top surfaces of the source electrode 142a, die drain electrode 142b, and the insulating layer 140, the oxide semiconductor layer is selectively etched to form the oxide semiconductor layer 144 (see FIG. 11B).

The oxide semiconductor layer 144 can be formed, using an In—Sn—Ga—Zn—O-based oxide semiconductor which is four-component metal oxide; an In—Ga—Zn—O-based oxide semiconductor, an In—Sn—Zn—O-based oxide semiconductor, an In—Al—Zn—O-based oxide semi conductor, a Sn—Ga—Zn—O-based oxide semiconductor, an Al—Ga—Zn—O-based oxide semiconductor, or a Sn—Al—Zn—O-based oxide semiconductor which are three-component metal oxide; an In—Zn—O-based oxide semiconductor, an In—Gap—O-base oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor which are two-component metal oxide; an In—O-based oxide semiconductor, a Sn—O-based oxide semiconductor, or a Zn—O-based oxide semiconductor which are single-component metal oxide; or the like. In addition, any of the above oxide semiconductors may contain an element other than in, Ga, Sn, and Zn, for example, $SiO_2$.

In particular, an In—Ga—Zn—O-based oxide semiconductor material has sufficiently high resistance without an electric field and thus the off-state current can be sufficiently reduced. In addition, the In—Ga—Zn—O-based oxide semiconductor material has high field-effect mobility and thus is suitable as a semiconductor material used for a semiconductor device.

As a typical example of the In—Ga—Zn—O-based oxide semiconductor material, the one represented, by $InGaO_3(ZnO)_m$ (m>0) is given. In addition, an oxide semiconductor material in which Ga is replaced by M and which is represented by $InMO_3(ZnO)_m$ (m>0) can also be given. Here, M denotes one or more metal elements selected from gallium (Ga), aluminum (Al), iron (Fe), nickel (Ni), manganese (Mn), cobalt (Co), and the like. For example, M can be Ga, Ga and Al, Ga and Fe, Ga and Ni, Ga and Mn, Ga and Co, or the like.

Note that the above compositions are merely examples given in accordance with a crystal structure.

As a target used for forming the oxide semiconductor layer 144 by a sputtering method, a target having a composition ratio of In:Ga:Zn=1:x:y (x is greater than or equal to 0 and y is greater than or equal to 0.5 and less than or equal to 5) is preferable. For example, a target having a composition ratio of $In_2O_3$:$Ga_2O_3$:ZnO–1:1:2 [molar ratio] (x=1, y=1) or the like can be used. Alternatively, a target, having a composition ratio of $In_2O_3$:$Ga_2O_3$:ZnO=1:1:1 [molar ratio] (x=1, y=0.5), a target having a composition ratio of $In_2O_3$:$Ga_2O_3$:ZnO=1:1:4 [molar ratio] (x=1, y=2), or a target having a composition ratio of $In_2O_3$:$Ga_2O_3$:ZnO=1:0:2 [molar ratio] (x=0, y–1) can be used.

In the case where an In—Zn—O-based material is used as an oxide semiconductor. a target thereof has a composition ratio of In:Zn=50:1 to 1:2 in an atomic ratio ($In_2O_3$: ZnO=25:1 to 1:4 in a molar ratio), preferably, In:Zn=20:1 to 1:1 in an atomic ratio ($In_2O_3$: ZnO=10:1 to 1:2 in a molar ratio), further preferably, In:Zn=15:1 to 1.5:1 in an atomic ratio ($In_2O_3$:ZnO=15:2 to 3:4 in a molar ratio). For example, in a target used for formation of an In—Zn—O-based oxide semiconductor which has an atomic ratio of In:ZnO=X:Y:Z, the relation of Z>1.5X+Y is satisfied.

In this embodiment, the oxide semiconductor layer 144 having an amorphous structure is formed by a sputtering method using an In—Ga—Zn—O-based metal oxide target. The thickness thereof is greater than or equal to 1 nm and less than or equal to 50 nm, preferably greater than or equal to 2 nm and less than or equal to 20 nm, more preferably greater than or equal to 3 nm and less than or equal to 15 nm.

The relative density of the metal oxide in the metal oxide target, is 80% or higher, preferably 95% or higher, more preferably 99.9% or higher. The use of the metal oxide target having high relative density makes it possible to form the oxide semiconductor layer having a dense structure.

The atmosphere in which the oxide semiconductor layer 144 is formed is preferably a rare gas (typically argon) atmosphere, an oxygen atmosphere, or a mixed atmosphere including a rare gas (typically argon) and oxygen. Specifically, for example, an atmosphere of a high-purity gas is preferable from which impurities such as hydrogen, water, a hydroxyl group, or hydride are removed so that the concentration thereof is reduced, to 1 ppm or less (preferably to 10 ppb or less).

In the formation of the oxide semiconductor layer 144, for example, an object to be processed is held in a process chamber that is kept under reduced pressure and the object is heated so that the temperature of the object becomes higher than or equal to 100° C. and lower than 550° C., preferably higher than, or equal to 200° C. and lower than or equal to 400° C. Alternatively, the temperature of the object in the formation of the oxide semiconductor layer 144 may be room temperature (25° C.±10° C.). Then, a sputtering gas from which hydrogen, water, and the like are removed, is introduced into the process chamber while moisture in the process chamber is removed, whereby the oxide semiconductor layer 144 is formed using the above-described target. By forming the oxide semiconductor layer 144 while heating the object, impurities in the oxide semiconductor layer 144 can be reduced. In addition, damage by sputtering can be reduced. In order to remove moisture in the process chamber, an entrapment vacuum pump is preferably used. For example, a cryopump, an ion pump, a titanium sublimation pump, or the like can be used. Further, a turbo pump provided with a cold trap may be used. By evacuation with the cryopump or the like, hydrogen, water, and the like can be removed from the process chamber, whereby the Impurity concentration in the oxide semiconductor layer can be reduced.

The oxide semiconductor layer 144 can be formed under the following conditions, for example: the distance between the object and the target is 170 mm, the pressure is 0.4 Pa, the direct current (DC) power is 0.5 kW, and the atmosphere is an oxygen (oxygen: 100%) atmosphere, an argon (argon: 100%) atmosphere, or a mixed atmosphere including oxygen and argon. Note that a pulsed direct current (DC) power source is preferable because dust (such, as powdery substances formed at the time of film formation) can be reduced and the film thickness can be uniform. The thickness of the oxide semiconductor layer 144 is greater than or equal to 1 nm and less than, or equal to 50 nm, preferably greater than or equal to 2 nm and less than or equal to 20 nm, more preferably greater than or equal to 3 nm and less than or equal to 15 nm. When a structure according to the disclosed invention is employed, a short-channel, effect due to miniaturization can be suppressed even in the case where the oxide semiconductor layer 144 having such a thickness is used. Note that the appropriate thickness differs depending on the oxide semiconductor material to be used, the intended use of the semiconductor device, or the like; therefore, the thickness can also be determined in accordance with the material, the intended use, or the like. Note that when the insulating layer 140 is formed, in the above manner, a surface of a portion where the channel formation region is to be formed in the oxide semiconductor layer 144 can be sufficiently planarized; thus, the oxide semiconductor layer can be suitably formed even when having a small thickness. As illustrated in FIG. 11B, the portion corresponding to the channel formation region, in the oxide semiconductor layer 144 preferably has a planar cross-sectional shape. When the portion corresponding to the channel formation region in the oxide semiconductor layer 144 has a planar cross-sectional shape, the leakage current can be lower than that in the case where the oxide semiconductor layer 144 does not have a planar cross-sectional shape.

Note that before the oxide semiconductor layer 144 is formed by a sputtering method, a substance attached to a surface where the oxide semiconductor layer 144 is to be formed (e.g., the surface of the insulating layer 140) may be preferably removed by reverse sputtering in which an argon gas is introduced and plasma is generated. Here, the reverse sputtering refers to a method in which ions collide with a surface to be processed in order to modify the surface, in contrast to normal sputtering in which ions collide with a sputtering target. As a method for making ions collide with a surface to be processed, a method is given for example where high-frequency voltage is applied to the surface to be processed in an argon atmosphere and plasma is generated in the vicinity of the object to be processed. Note that the atmosphere may be nitrogen, helium, oxygen, or the like instead of an argon atmosphere.

After the oxide semiconductor layer 144 is formed, heat treatment (first heat treatment) is preferably performed on the oxide semiconductor layer 144. By the first heat treatment, excessive hydrogen (including water and a hydroxyl group) m the oxide semiconductor layer 144 can be removed, the structure of the oxide semiconductor layer 144 can be improved, and defect levels in the energy gap can be reduced. The temperature of the first heat treatment is, for example, higher than or equal to 300° C. and lower than 550° C., preferably higher than or equal to 400° C. and lower than or equal to 500° C.

The heat treatment can be performed in such, a manner that, for example, the object to be processed is introduced into an electric furnace provided with a resistance heating element or the like and heated at 450° C. for one hour in a nitrogen atmosphere. During the heat treatment, the oxide semiconductor layer is not exposed to air to prevent entry of water and hydrogen.

The heat treatment apparatus is not limited to the electric furnace and may be an apparatus for heating an object by thermal conduction or thermal radiation from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the gas, an inert gas that does not react with the object by heat treatment, for example, nitrogen or a rare gas such as argon is used.

For example, as the first heat treatment, GRTA treatment may be performed in which the object is put in a heated inert gas atmosphere and heated for several minutes, and then taken out of the inert gas atmosphere. GRTA treatment enables high-temperature heat treatment for a short time. Moreover, GRTA treatment enables treatment at a temperature which exceeds the upper temperature limit of the object. Note that the inert gas may be changed to a gas including oxygen during the treatment This is because defect levels in the energy gap due to oxygen deficiency can be reduced by performing the first heat treatment in an atmosphere including oxygen.

Note that as the inert gas atmosphere, an atmosphere that includes nitrogen or a rare gas (such as helium, neon, or argon) as a main component and does not include water, hydrogen, or the like is preferably used. For example, the purity of nitrogen or a rare gas such as helium, neon, or argon, introduced into the heat treatment apparatus is higher than or equal to 6N (99.9999%), preferably higher man or equal to 7N (99.99999%) (that is, the impurity concentration is lower than or equal to 1 ppm, preferably lower than or equal to 0.1 ppm).

In any case, impurities are reduced by the first heat treatment so that the i-type (intrinsic) or substantially i-type oxide semiconductor layer is obtained. Accordingly, a transistor having significantly excellent characteristics can be realized.

The above heat treatment (first heat treatment) has an effect of removing hydrogen, water, and the like and thus can be referred to as dehydration treatment, dehydrogenation treatment, or the like. The dehydration treatment or the dehydrogenation treatment can also be performed at the following timing: after the formation of the oxide semiconductor layer 144, after the formation of the gate insulating layer 146 formed later, after the formation of the gate electrode, or the like. Such dehydration treatment or dehydrogenation treatment may be performed once or more times.

The etching of the oxide semiconductor layer 144 may be performed, before or after the heat treatment. In addition, although dry etching is favorable in terms of miniaturization of elements, wet etching may be used. An etching gas and an etchant can be selected as appropriate in accordance with a material to be etched. Note that in the case where a problem of leakage current and the like between elements does not occur, the oxide semiconductor layer may be used without being etched into an island shape.

Figure 11C:
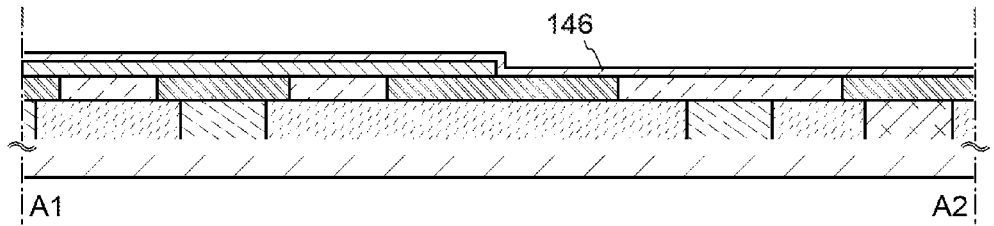

Next the gate insulating layer 146 is formed so as to cover the oxide semiconductor layer 144 (see FIG. 11C).

The gate insulating layer 146 can be formed by a CVD method, a sputtering method, or the like. The gate insulating layer 146 preferably includes silicon oxide, silicon nitride, silicon, oxynitride, aluminum oxide, tantalum oxide, hafnium oxide, yttrium oxide, hafnium silicate ($HfSi_xO_y$, (x>0, y>0)), hafnium silicate ($HfSi_xO_y$, (x>0, y>0)) to which nitrogen is added, hafnium aluminate ($HfAl_xO_y$, (x>0, y>0)) to which nitrogen, is added, or the like. The gate insulating layer 146 may have a single-layer structure or a stacked structure. There is no particular limitation on the thickness of the gate insulating layer 146; in the ease where the semiconductor device is miniaturized, the gate insulating layer 146 is preferably thin in order to ensure the operation of the transistor. For example, in the case of using silicon oxide, the thickness can he greater than or equal to 1 nm and less than or equal to 100 nm, preferably greater than or equal to 10 nm and less than or equal to 50 nm.

When the gate insulating layer is thin as in the above description, a problem of gate leakage due to a tunneling effect or the like is caused. In order to solve the problem of gate leakage, it is preferable that the gate insulating layer 146 be formed using a high dielectric constant (high-k) material such as hafnium, oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, or hafnium aluminate ($HfAl_xO_y$ (x>0, y>0)) to which nitrogen is added. With the use of a high-k material for the gate insulating layer 146, the thickness of the gate insulating layer 146 can be increased to prevent gate leakage and at the same time electrical characteristics can be maintained. For example, the dielectric constant of hafnium oxide is approximately 15, which is much higher than that of silicon oxide which is 3 to 4. With such a material, a gate insulating layer where the equivalent oxide thickness is less than 15 nm, preferably greater than or equal to 2 nm and less than or equal to 10 nm, can be easily formed. Note that a stacked structure of a film including a high-k material and a film including any of silicon oxide, silicon nitride, silicon oxynitride, silicon nitride oxide, aluminum oxide, and the like may be employed.

After the gate insulating layer 146 is formed, second heat treatment is preferably performed in an inert gas atmosphere or an oxygen atmosphere. The temperature of the heat treatment is higher than, or equal to 200° C. and lower than or equal to 450° C. preferably higher than or equal to 250° C. and lower than or equal to 350° C. For example, the heat treatment may be performed at 250° C. for one hour in a nitrogen atmosphere. The second heat treatment can reduce variation in electric characteristics of the transistors. Moreover, in the case where the gate insulating layer 146 includes oxygen, oxygen can be supplied to the oxide semiconductor layer 144 and oxygen deficiency in the oxide semiconductor layer 144 can be filled; thus, an i-type (intrinsic) or substantially i-type oxide semiconductor layer can be formed.

Note that the second heat treatment is performed after the gate insulating layer 146 is formed in this embodiment; however, the timing of the second heat treatment is not limited to this. For example, the second heat treatment may be performed after the gate electrode is formed. Alternatively, the first heat treatment and the second heat treatment may be successively performed, the first heat treatment may double as the second heat treatment, or the second heat treatment may double as the first heat treatment.

As described above, at least one of the first heat treatment and the second heat treatment is employed, whereby impurities which are not the main components of the oxide semiconductor are excluded as much as possible and the oxide semiconductor layer 144 can be highly purified.

Figure 11D:
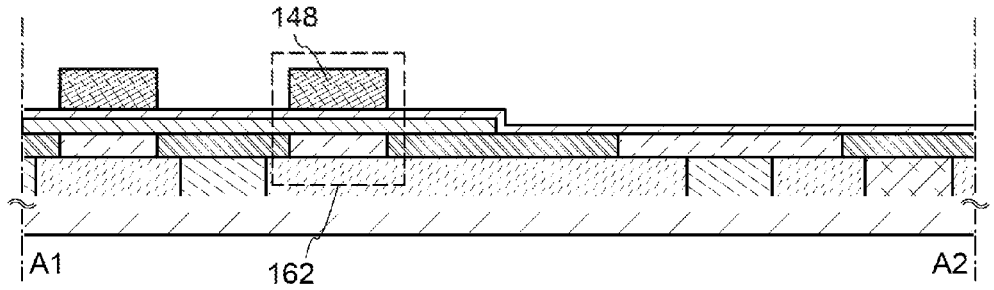

Next, the gate electrode 148 is formed over the gate insulating layer 146 (see FIG. 11D).

The gate electrode 148 can be formed by forming a conductive layer over the gate insulating layer 146 and then selectively etching the conductive layer. The conductive layer to be processed, into the gate electrode 148 can be formed by a PVD method typified by a sputtering method or a CVD method such as a plasma CVD method. The details are similar to those of the source electrode 142a, the drain electrode 142b, and the like; thus, description thereof can be referred to. Note that in the case where the semiconductor device illustrated in FIG. 8C is manufactured, the gate electrode 148 and the electrode 153 may be formed at the same time.

Through the above steps, the transistor 162 including the highly purified oxide semiconductor layer 144 is completed (see FIG. 11D). Such a transistor 162 has a characteristic of sufficiently reduced off-state current. Therefore, with the use of the transistor as a writing transistor, charge can be held for a long time.

Figure 12A:
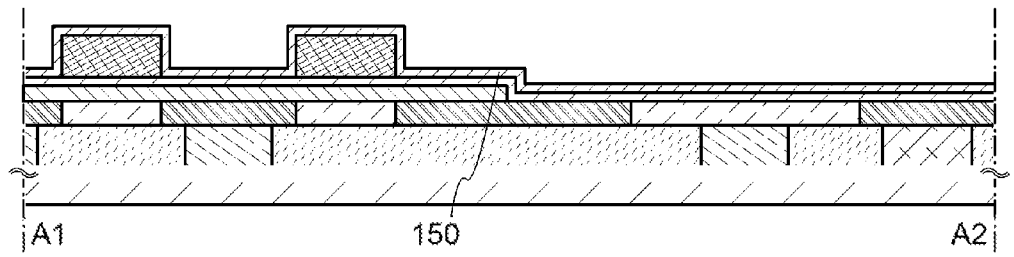
FIGS. 12A to 12D are cross-sectional views illustrating manufacturing steps of a semiconductor device.

Then, the insulating layer 150 is formed over the gate insulating layer 146 and the gate electrode 148 (see FIG. 12A). The insulating layer 150 can be formed by a PVD method, a CVD method, or the like. The insulating layer 150 can be formed so as to have a single-layer structure or a stacked structure using a material including an inorganic insulating material such as silicon oxide, silicon oxynitride, silicon nitride, hafnium oxide, or aluminum oxide.

Note that for the insulating layer 150, a material with a low dielectric constant may be preferably used or a structure with a low dielectric constant (e.g., a porous structure) may be preferably employed. This is because by reducing the dielectric constant of the insulating layer 150, capacitance between wirings and electrodes can be reduced, which will increase operation speed.

Note that in the case where a structure is employed in which the capacitor 364 does not include the gate insulating layer 146, the gate insulating layer 146 over the source electrode 142a and in a region where the capacitor 164 is to be formed may be removed before the insulating layer 150 is formed.

Figure 12B:
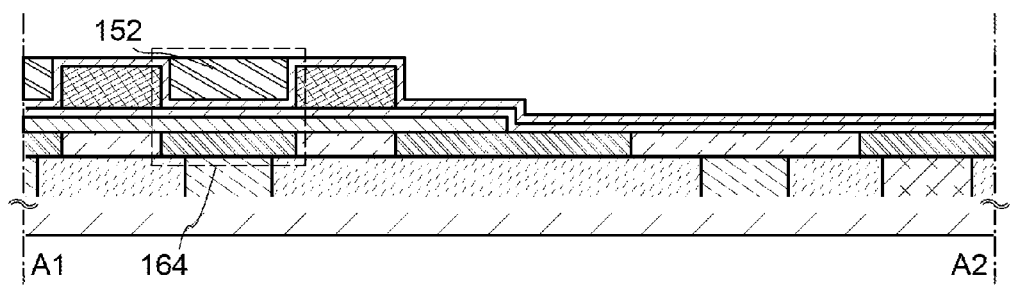

Next, the electrode 152 is formed over the insulating layer 150 so as to overlap with the source electrode 142a (see FIG. 12B). The method and materials for forming the gate electrode 148 can be applied to the electrode 152; therefore, the description of the gate electrode 148 can be referred to for the details of the electrode 152. Through the above steps, the capacitor 164 is completed.

Figure 12C:
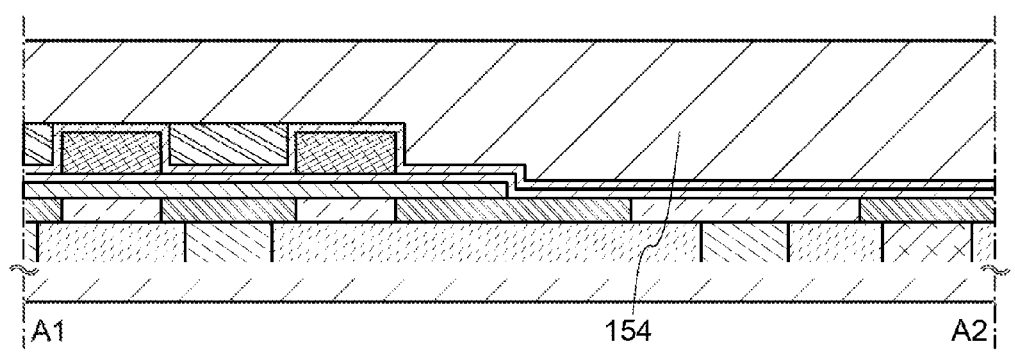
Figure 12D:
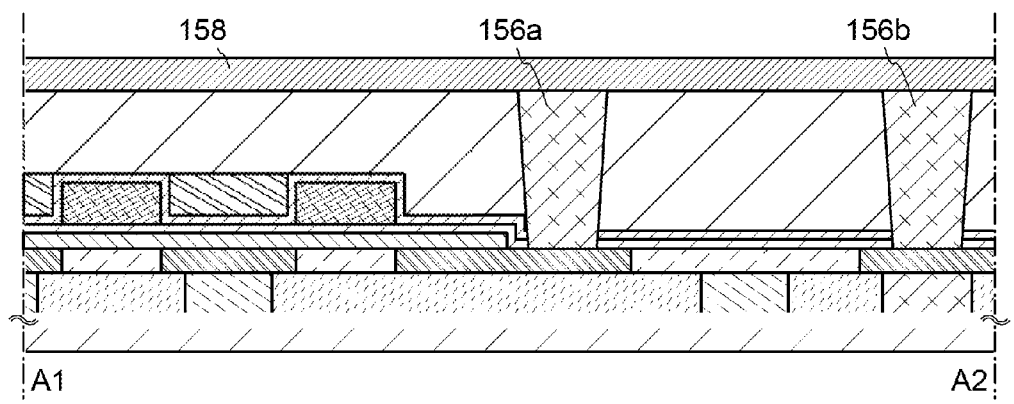

Next, the insulating layer 154 is formed over the insulating layer 150 and the electrode 152 (see FIG. 12C). Like the insulating layer 150, the insulating layer 154 can be formed by a PVD method, a CVD method, or the like. The insulating layer 154 can be formed, so as to have a single-layer structure or a stacked structure using a material including an inorganic insulating material such as silicon oxide, silicon oxynitride, silicon nitride, hafnium oxide, or aluminum oxide.

Note that for the insulating layer 154, a material with a low dielectric constant may be preferably used or a structure with a low dielectric constant (e.g., a porous structure) may be preferably employed. This is because by reducing the dielectric constant of the insulating layer 154, capacitance between wirings and electrodes can be reduced, which will increase operation speed.

Note that the insulating layer 154 is preferably formed so as to have a planarized surface. By forming the insulating layer 154 having a planarized surface, an electrode, a wiring, or the like can be favorably formed over the insulating layer 154 even in the case where the semiconductor device is miniaturized, for example. The insulating layer 154 can be planarized by a method, such as chemical mechanical polishing (CMP).

Next, an opening reaching the drain electrode 142b and an opening reaching the electrode 142c are formed in the gate insulating layer 146, the insulating layer 150, and the insulating layer 154. After that, the electrode 156a and the electrode 156b are formed in the openings, and the wiring 158 is formed over the insulating layer 154 to be in contact with the electrode 156a and the electrode 156b (see FIG. 12D). The openings are formed by selective etching using a mask or the like.

The electrode 156a and the electrode 156b can be formed in such a manner that, for example, a conductive layer is formed by a PVD method, a CVD method, or the like in a region including the openings and then part of the conductive layer is removed by etching treatment, CMP, or the like.

More specifically, it is possible to employ a method in which a thin titanium film is formed by a PVD method in a region including the openings, a thin titanium nitride film is formed by a CVD method, and then a tungsten film is formed so as to fill the openings. Here, the titanium film formed, by a PVD method has a function of reducing an oxide film (such, as a natural oxide film) over which the titanium film is to be formed, and thereby lowering contact resistance with lower electrodes or the like (the drain electrode 142b, here). The titanium nitride film formed after the formation of the titanium film has a barrier function of suppressing diffusion of the conductive material. A copper film may be formed by a plating method after the formation of the barrier film of titanium, titanium nitride, or the like.

The wiring 158 is formed by a PVD method typified by a sputtering method or a CVD method such as a plasma CVD method and then patterning the conductive layer. As a material for the conductive layer, an element selected from aluminum, chromium, copper, tantalum, titanium, molybdenum, or tungsten; an alloy including any of these elements as a component; or the like can be used. Any of manganese, magnesium, zirconium, beryllium, neodymium, scandium, or a material including any of these in combination may be used. The details are similar to those of the source electrode 142a or the like.

Note that a variety of wirings, electrodes, or the like may be formed after the above steps. The wirings or the electrodes can be formed by a method such as a so-called damascene method or dual damascene method.

Through the above steps, the semiconductor device having the structure illustrated in FIGS. 6A and 6B can be manufactured.

In the transistor 162 described in this embodiment, the oxide semiconductor layer 144 is highly purified and thus the hydrogen concentration therein is lower than or equal to $5 \times 10^{19}$ atoms/cm$^3$, preferably lower than or equal to $5 \times 10^{18}$ atoms/cm$^3$, more preferably lower than or equal to $5 \times 10^{17}$ atoms/cm$^3$. The carrier density of the oxide semiconductor layer 144 is sufficiently low (e.g., lower than $1 \times 10^{18}$/cm$^3$, preferably lower than $1.45 \times 10^{16}$/cm$^3$) as compared to the carrier density of a general silicon wafer (approximately $1 \times 10^{14}$/cm$^3$). Accordingly, the off-state current of the transistor 162 is also sufficiently small. For example, the off-state current (here, current per micrometer (μm) of channel width) of the transistor 162 at room temperature (25° C.) is 100 zA (1 zA (zeptoampere) is $1 \times 10^{-21}$ A) or less, preferably 10 zA or less.

With the use of the highly purified intrinsic oxide semiconductor layer 144, the off-state current of the transistor 162 can be sufficiently reduced easily. Further, with the use of such a transistor 162, a semiconductor device capable of holding stored data for an extremely long time can be obtained.

In the semiconductor device described in this embodiment, the transistors each including an oxide semiconductor in the memory cells of the semiconductor device are connected in series; thus, the source electrode of the transistor including an oxide semiconductor in the memory cell and the drain electrode of the transistor including an oxide semiconductor in the adjacent memory cell can be connected to each other. That is, one of the source electrode and the drain electrode of the transistor including an oxide semiconductor does not need to be connected to the wiring through an opening. Therefore, the area occupied by the memory cells can be reduced, whereby the degree of integration of the semiconductor device can be increased and the storage capacity per unit area can be increased.

The structures, methods, and the like described in this embodiment can be combined as appropriate with any of the structures, methods, and the like described in the other embodiments.

[Embodiment 3]

In this embodiment, the case where the semiconductor device described in the above embodiment is applied to an electronic device will be described with reference to FIGS. 13A to 13F. In this embodiment, the case where the above semiconductor device is applied to electronic devices such as a computer, a mobile phone (also referred to as a mobile telephone or a mobile telephone device), a portable information terminal (including a portable game console, an audio player, and the like), a camera such as a digital camera or a digital video camera, an electronic paper, and a television device (also referred to as a television or a television receiver) will be described.

Figure 13A:
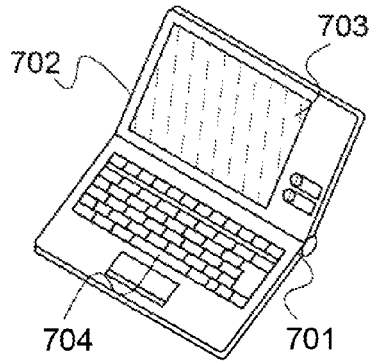
FIGS. 13A to 13F each illustrate an electronic device including a semiconductor device.

FIG. 13A is a notebook personal computer including a housing 701, a housing 702, a display portion 703, a keyboard 704, and the like. The semiconductor device described in the above embodiment is provided in at least one of the housing 701 and the housing 702. Consequently, the notebook personal computer cast perform writing and reading of data at high speed and store data for a long time with sufficiently reduced power consumption.

Figure 13D:
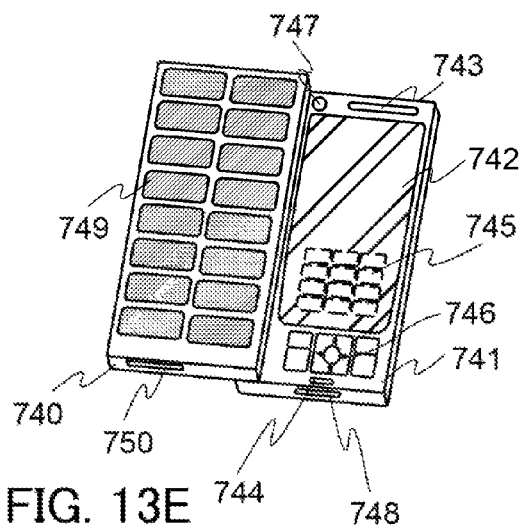
Figure 13B:
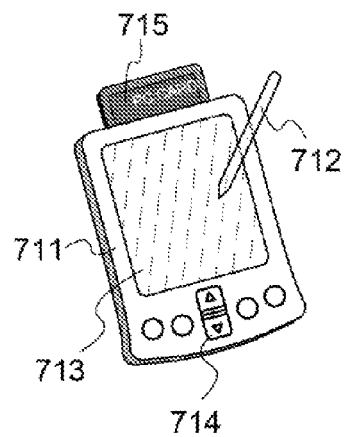

FIG. 13B is a portable information terminal (personal digital assistant (PDA)). A main body 711 is provided with a display portion 713, an external interface 715, operation buttons 714, and the like. Further, a stylus 712 for operating the portable information terminal or the like is also provided. The semiconductor device described in the above embodiment is provided in the main body 711. Consequently, the portable information terminal can perform writing and reading of data at high speed and store data for a long time with sufficiently reduced power consumption.

Figure 13E:
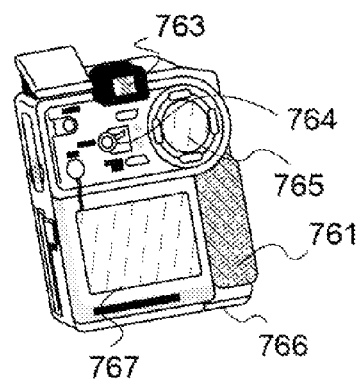
Figure 13C:
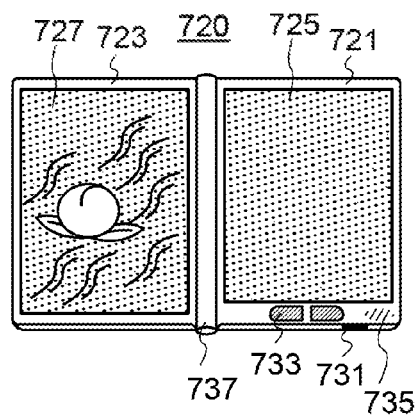

FIG. 13C is an e-book reader mounted with an electronic paper. An e-book reader 720 has two housings, a housing 721 and a housing 723. The housing 721 and the housing 723 are provided with a display portion 725 and a display portion 727, respectively. The housing 721 and the housing 723 are connected, by a hinge 737 and can be opened and closed, along the hinge 737. Further, the housing 721 is provided with a power switch 731, operation keys 733, a speaker 735, and the like. At least one of the housing 721 and the housing 723 is provided with the semiconductor device described in the above embodiment. Consequently, the e-book reader can perform writing and reading of data at high speed and store data for a long time with sufficiently reduced power consumption.

FIG. 13D is a mobile phone including two housings, a housing 740 and a housing 741. Further, the housing 740 and the housing 741 in a state where they are developed as illustrated in FIG. 13D can shift by sliding so that one is lapped over the other; therefore, the size of the mobile phone can be reduced, which makes the mobile phone suitable for being carried. The housing 741 includes a display panel 742, a speaker 743, a microphone 744, operation keys 745, a pointing device 746, a camera lens 747, an external connection terminal 748, and the like. The housing 740 includes a solar cell 749 for charging the mobile phone, an external memory slot 750, and the like. The display panel 742 has a touch panel function. A plurality of operation keys 745 displayed as images are indicated by dashed lines in FIG. 13D. In addition, an antenna is incorporated in the housing 741. At least one of the housings 740 and 741 is provided with the semiconductor device described in the above embodiment. Consequently, the mobile phone can perform writing and reading of data at high speed and store data for a long time with sufficiently reduced power consumption.

FIG. 13E is a digital camera including a main body 761, a display portion 767, an eyepiece 763, an operation switch 764, a display portion 765, a battery 766, and the like. The semiconductor device described in the above embodiment is provided in the main body 761. Consequently, the digital camera can perform writing and reading of data at high speed and store data for a long time with sufficiently reduced power consumption.

Figure 13F:
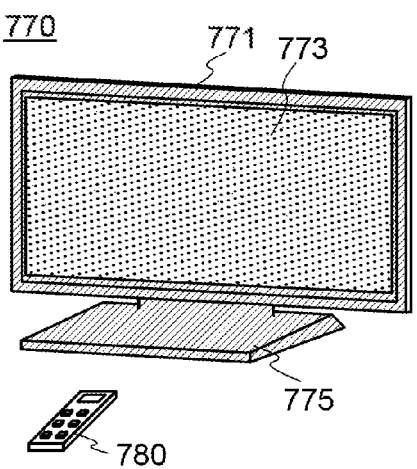

FIG. 13F is a television device. A television device 770 includes a housing 771, a display portion 773, a stand 775, and the like. The television device 770 can be operated by an operation switch of the housing 771 or a remote controller 780. The housing 771 and the remote controller 780 are mounted with the semiconductor device described in the above embodiment. Consequently, the television device can perform writing and reading of data at high speed and store data for a long time with sufficiently reduced power consumption.

Thus, the electronic devices described in this embodiment are mounted with the semiconductor device according to the above embodiment. Accordingly, electronic devices with low power consumption can be realized.

This application is based on Japanese Patent Application Ser. No. 2010-064819 filed with Japan Patent Office on Mar. 19, 2010, the entire contents of which are hereby incorporated by reference.

The invention claimed is:

1. A semiconductor device comprising:
   a source line;
   a bit line;
   m (m is an integer greater than or equal to 2) signal lines;
   m word lines;
   a selection line;
   first to m-th memory cells connected in series between the source line and the bit line; and
   a selection transistor whose gate terminal is electrically connected to the selection line,
   wherein the first to m-th memory cells each comprise:
      a first transistor comprising a first gate terminal, a first source terminal, and a first drain terminal;
      a second transistor comprising a second gate terminal, a second source terminal, and a second drain terminal; and
      a capacitor,
   wherein the second transistor includes an oxide semiconductor layer,
   wherein the source line is electrically connected to the first source terminal in the m-th memory cell through the selection transistor,
   wherein the bit line is electrically connected to the second drain terminal in the first memory cell and is electrically connected to the first drain terminal in the first memory cell,
   wherein the k-th (k is a natural number greater than or equal to 1 and less than or equal to m) signal line is electrically connected to the second gate terminal in the k-th memory cell,
   wherein the k-th word line is electrically connected to one terminal of the capacitor in the k-th memory cell,
   wherein the second drain terminal in the l-th (l is a natural number greater than or equal to 2 and less than or equal to m) memory cell is electrically connected to the first gate terminal in the (l−1)-th memory cell, the second source terminal in the (l−1)-th memory cell, and the other terminal of the capacitor in the (l−1)-th memory cell,
   wherein the first gate terminal in the m-th memory cell, the second source terminal, in the m-th memory cell, and the other terminal of the capacitor in the m-th memory cell are electrically connected to one another, and
   wherein the first drain terminal in the l-th memory cell is electrically connected to the first source terminal in the (l−1)-th memory cell.

2. The semiconductor device according to claim 1,
   wherein the first transistor comprises:
      a channel formation region provided in a substrate including a semiconductor material;
      impurity regions provided so that the channel formation region is sandwiched between the impurity regions;
      a first gate insulating layer over the channel formation region; and
      a first gate electrode provided over the first gate insulating layer so as to overlap with the channel formation region, and
   wherein the second transistor comprises;
      a second source electrode and a second drain electrode which are electrically connected to the oxide semiconductor layer;
      a second gate electrode provided over the oxide semiconductor layer; and
      a second gate insulating layer provided between the oxide semiconductor layer and the second gate electrode.

3. The semiconductor device according to claim 2,
   wherein the second drain electrode in the l-th memory cell and the second source electrode in the (l−1)-th memory cell are formed from the same conductive layer.

4. The semiconductor device according to claim 2,
   wherein the second drain electrode in the l-th memory cell, the second source electrode in the (l−1)-th memory cell, and the first gate electrode in the (l−1)-th memory cell are formed from the same conductive layer.

5. The semiconductor device according to claim 2,
   wherein the substrate including the semiconductor material is a single crystal semiconductor substrate or an SOI substrate.

6. The semiconductor device according to claim 2,
   wherein the semiconductor material is silicon.

7. The semiconductor device according to claim 1,
   wherein the oxide semiconductor layer includes an oxide semiconductor material containing In, Ga, and Zn.

8. A semiconductor device comprising:
   a source line;
   a bit line;
   m (m is an integer greater than or equal to 2) signal lines;
   m word lines;

a first selection line;
a second selection line;
first to m-th memory cells connected in series between the source line and the bit line;
a first selection transistor whose gate terminal is electrically connected to the first selection line; and
a second selection transistor whose gate terminal is electrically connected to the second selection line,
wherein the first to m-th memory cells each comprise;
   a first transistor comprising a first gate terminal, a first source terminal, and a first drain terminal;
   a second transistor comprising a second gate terminal, a second source terminal, and a second drain terminal; and
   a capacitor,
wherein the second transistor includes an oxide semiconductor layer,
wherein the source line is electrically connected to the first source terminal in the m-th memory cell through the second selection transistor,
wherein the bit line is electrically connected to the second drain terminal in the first memory cell, and is electrically connected to the first drain terminal in the first memory cell through the first selection transistor,
wherein the k-th (k is a natural number greater than or equal to 1 and less than or equal to m) signal line is electrically connected to the second gate terminal in the k-th memory cell,
wherein the k-th word line is electrically connected to one terminal of the capacitor in the k-th memory cell,
wherein the second drain terminal, in the l-th (l is a natural number greater than or equal to 2 and less than or equal to m) memory cell is electrically connected to the first gate terminal in the (l−1)-th memory cell, the second source terminal in the (l−1)-th memory cell, and the other terminal of the capacitor in the (l−1)-th memory cell,
wherein the first gate terminal in the m-th memory cell, the second source terminal in the m-th memory cell, and the other terminal of the capacitor in the m-th memory cell are electrically connected to one another, and
wherein the first drain terminal in the l-th memory cell is electrically connected to the first source terminal in the (l−1)-th memory cell.

9. The semiconductor device according to claim 8,
wherein the first transistor comprises;
   a channel formation region provided in a substrate including a semiconductor material;
   impurity regions provided so that the channel formation region is sandwiched between the impurity regions;
   a first gate insulating layer over the channel formation region; and
a first gate electrode provided over the first gate insulating layer so as to overlap with the channel formation region, and
wherein the second transistor comprises;
   a second, source electrode and a second drain electrode which are electrically connected to the oxide semiconductor layer;
   a second gate electrode provided over the oxide semiconductor layer; and
   a second gate insulating layer provided between the oxide semiconductor layer and the second gate electrode.

10. The semiconductor device according to claim 9,
wherein the second drain electrode in the l-th memory cell and the second source electrode in the (l−1)-th memory cell are formed from the same conductive layer.

11. The semiconductor device according to claim 9,
wherein the second drain electrode in the l-th memory cell, the second source electrode in the (l−1)-th memory cell, and the first gate electrode in the (l−1)-th memory cell are formed from the same conductive layer.

12. The semiconductor device according to claim 9,
wherein the substrate including the semiconductor material is a single crystal semiconductor substrate or an SOI substrate.

13. The semiconductor device according to claim 9,
wherein the semiconductor material is silicon.

14. The semiconductor device according to claim 8,
wherein the oxide semiconductor layer includes an oxide semiconductor material containing In, Ga, and Zn.

* * * * *

UNITED STATES PATENT AND TRADEMARK OFFICE
CERTIFICATE OF CORRECTION

Page 1 of 3

PATENT NO. : 8,598,648 B2
APPLICATION NO. : 13/044674
DATED : December 3, 2013
INVENTOR(S) : Kiyoshi Kato, Satohiro Okamoto and Shuhei Nagatsuka It is certified that error appears in the above-identified patent and that said Letters Patent is hereby corrected as shown below:

In the Specification

Column 2, line 45, replace "hit" with --bit--;

Column 3, line 27, replace "m" with --in--;

Column 3, line 48, replace "imparity" with --impurity--;

Column 3, line 64, replace "fanned" with --formed--;

Column 4, line 2, replace "he" with --The--;

Column 4, line 25, replace "loaned" with --formed--;

Column 4, line 62, replace "aiming" with --turning--;

Column 6, line 17, replace "<Base" with --<Basic--;

Column 6, line 41, replace "die" with --the--;

Column 7, line 12, replace "die" with --the--;

Column 7, line 15, replace "man" with --than--;

Column 7, line 37, replace "Is" with --is--;

Column 7, line 38, replace "ease" with --case--;

Column 9, line 48, replace "$\in_{x1}$" with --$\in_{r1}$--;

Column 9, line 50, replace "$\in_{x2}$" with --$\in_{r2}$--;

Signed and Sealed this
Twentieth Day of May, 2014

Michelle K. Lee
*Deputy Director of the United States Patent and Trademark Office*

Column 9, line 61, replace "$\in_{x1}$" with --$\in_{r1}$--;

Column 9, line 64, replace "$\in_{x2}$" with --$\in_{r2}$--;

Column 10, line 23, replace "hit" with --bit--;

Column 10, line 30, replace "hit" with --bit--;

Column 10, line 44, replace "winch" with --which--;

Column 11, line 8, after "row." replace "in" with --In--;

Column 13, line 3, replace "ease" with --case--;

Column 13, line 10, replace "$_{13\ 2}$" with --$_{\_2}$--;

Column 13, line 33, replace "t o torn" with --to turn--;

Column 13, line 47, replace "he" with --be--;

Column 13, line 59, replace "it" with --k--;

Column 15, line 41, replace "10" with --10A--;

Column 16, line 18, replace "68" with --6B--;

Column 16, line 41, replace "eases" with --cases--;

Column 17, line 25, replace "sate" with --gate--;

Column 17, line 62, replace "winch" with --which--;

Column 18, line 25, replace "342b" with --142b--;

Column 19, line 42, replace "he" with --be--;

Column 19, line 59, replace "ease" with --case--;

Column 20, line 1, replace "78" with --7B--;

Column 20, line 40, replace "die" with --the--;

Column 21, lines 37-38, replace "alumnosilicate" with --aluminosilicate--;

Column 21, lines 38-39, replace "bore silicate" with --borosilicate--;

Column 23, line 13, replace "imparity" with --impurity--;

Column 23, line 51, replace "he" with --be--;

CERTIFICATE OF CORRECTION (continued)

U.S. Pat. No. 8,598,648 B2

Column 24, line 58, replace "noncrystalline" with --polycrystalline--;

Column 26, line 35, replace "die" with --the--;

Column 26, line 41, replace "tire transistor 162 in the tipper" with --the transistor 162 in the upper--;

Column 26, line 59, replace "planatize" with --planarize--;

Column 27, line 29, replace "die" with --the--;

Column 27, line 41, replace "In-Gap-O" with --In-Ga-O--;

Column 27, line 48, after "than" replace "in" with --In--;

Column 28, line 23, replace "In:ZnO = X:Y:Z," with --In:Zn:O = X:Y:Z,--;

Column 29, line 1, replace "Impurity" with --impurity--;

Column 29, line 58, replace "m" with --in--;

Column 30, line 39, replace "man" with --than--;

Column 31, line 11, replace "ease" with --case--;

Column 31, line 15, replace "he" with --be--;

Column 32, line 36, replace "364" with --164--;

Column 33, line 56, replace "$1 \times 10^{18}/cm^3$," with --$1 \times 10^{12}/cm^3$--;

Column 33, line 57, replace "$1.45 \times 10^{16}/cm^3$)" with --$1.45 \times 10^{10}/cm^3$)--;

Column 34, line 39, replace "east" with --can--;

In the Claims

Column 36, line 19, in claim 1 after "terminal" delete ",";

Column 36, line 36, in claim 2 after "comprises" replace ";" with --:--;

Column 37, line 9, in claim 8 after "comprise" replace ";" with --:--;

Column 37, line 32, in claim 8 after "terminal" delete ",";

Column 38, line 5, in claim 9 after "comprises" replace ";" with --:--;

Column 38, line 14, in claim 9 after "comprises" replace ";" with --:--.